(12) United States Patent
Yamada

(10) Patent No.: US 12,538,834 B2
(45) Date of Patent: Jan. 27, 2026

(54) SEMICONDUCTOR DEVICE WITH SEALING SURFACES OF DIFFERENT HEIGHT AND SEMICONDUCTOR DEVICE MANUFACTURING METHOD

(71) Applicant: FUJI ELECTRIC CO., LTD., Kawasaki (JP)

(72) Inventor: Takafumi Yamada, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 505 days.

(21) Appl. No.: 18/192,277

(22) Filed: Mar. 29, 2023

(65) Prior Publication Data

US 2023/0335452 A1   Oct. 19, 2023

(30) Foreign Application Priority Data

Apr. 13, 2022   (JP) ................. 2022-066234

(51) Int. Cl.
| | |
|---|---|
| *H01L 23/31* | (2006.01) |
| *H01L 21/56* | (2006.01) |
| *H01L 23/00* | (2006.01) |
| *H01L 23/367* | (2006.01) |
| *H01L 23/46* | (2006.01) |

(52) U.S. Cl.
CPC .......... *H01L 23/3121* (2013.01); *H01L 21/56* (2013.01); *H01L 23/3672* (2013.01); *H01L 23/46* (2013.01); *H01L 24/32* (2013.01); *H01L 24/33* (2013.01); *H01L 2224/32245* (2013.01); *H01L 2224/33181* (2013.01)

(58) Field of Classification Search
CPC .................................................. H01L 23/3121
USPC .......................................................... 257/668
See application file for complete search history.

(56) References Cited

U.S. PATENT DOCUMENTS

| | | | |
|---|---|---|---|
| 2006/0272150 A1* | 12/2006 | Eguchi ................. | H05K 5/0082 29/841 |
| 2019/0341429 A1* | 11/2019 | Park ...................... | G06F 3/0412 |
| 2020/0170147 A1 | 5/2020 | Arai | |

(Continued)

FOREIGN PATENT DOCUMENTS

| | | |
|---|---|---|
| EP | 1643818 A1 | 4/2006 |
| JP | 2000-174170 A | 6/2000 |
| JP | 2012-186371 A | 9/2012 |

(Continued)

*Primary Examiner* — Ajay Arora
(74) *Attorney, Agent, or Firm* — Rabin & Berdo, P.C.

(57) ABSTRACT

A semiconductor device, including a cooling body, a semiconductor unit including a wiring portion electrically connected to a semiconductor chip, and a sealing member sealing the entire semiconductor unit over a cooling surface of the cooling body. The sealing member includes a first portion and a second portion which surrounds the first portion in a plan view. The first portion seals a central portion of a main electrode of the semiconductor chip, and has a first sealing surface opposite the cooling surface of the cooling body. The second portion seals a wiring portion to thereby surround the first portion in the plan view, and has a second sealing surface opposite the cooling surface. A distance in a thickness direction of the semiconductor device from the cooling surface to the first sealing surface, is smaller than a distance in the thickness direction from the cooling surface to the second sealing surface.

17 Claims, 19 Drawing Sheets

(56) References Cited

U.S. PATENT DOCUMENTS

2023/0067156 A1\* 3/2023 Yamada ................ H01L 23/053

FOREIGN PATENT DOCUMENTS

| JP | 2020-092250 A | 6/2020 |
| WO | 2005/004563 A1 | 1/2005 |

\* cited by examiner

SEMICONDUCTOR DEVICE WITH SEALING SURFACES OF DIFFERENT HEIGHT AND SEMICONDUCTOR DEVICE MANUFACTURING METHOD

CROSS-REFERENCE TO RELATED APPLICATION

This application is based upon and claims the benefit of priority of the prior Japanese Patent Application No. 2022-066234, filed on Apr. 13, 2022, the entire contents of which are incorporated herein by reference.

BACKGROUND OF THE INVENTION

1. Field of the Invention

The embodiments discussed herein relate to a semiconductor device and a semiconductor device manufacturing method.

2. Background of the Related Art

A semiconductor device includes a semiconductor module and a cooler. A refrigerant flows inside the cooler. By doing so, the cooler cools the semiconductor module which generates heat and maintains the reliability of the semiconductor module (see, for example, Japanese Laid-open Patent Publication No. 2020-092250).

The semiconductor module includes semiconductor chips and an insulated circuit board to which the semiconductor chips are bonded with a bonding member therebetween. Furthermore, the semiconductor module includes lead frames which connect main electrodes of the semiconductor chips and wiring boards of the insulated circuit board with a bonding member therebetween. This insulated circuit board is mounted on the cooler. In addition, the insulated circuit board including the semiconductor chips and the lead frames is sealed with a sealing member on the cooler.

The semiconductor chips are bonded to the wiring boards with the bonding member therebetween and the lead frames are bonded to the main electrodes on the front surfaces of the semiconductor chips with the bonding member therebetween. Accordingly, when the semiconductor chips included in the semiconductor device operate and generate heat, a crack may appear in the bonding member on the front surface or the back surface of a semiconductor chip due to the difference in linear expansion coefficient between the members. If a crack appears in the bonding member between a lead frame and a semiconductor chip, then a current is concentrated in a portion in which a crack does not appear. Furthermore, if a crack appears in the bonding member between a semiconductor chip and a wiring board, then thermal resistance increases and the property of dissipating heat generated by the semiconductor chip deteriorates. As a result, the reliability of the semiconductor device deteriorates and it is impossible to lengthen its life.

SUMMARY OF THE INVENTION

According to an aspect, there is provided a semiconductor device, including: a cooling body that includes a top plate having a cooling surface; a semiconductor unit, including: a board located over the cooling surface of the top plate, a semiconductor chip located over a front surface of the board, the semiconductor chip having a main electrode formed on a front surface thereof, and a wiring portion electrically connected to the semiconductor chip; and a sealing member which seals the entire semiconductor unit over the cooling surface, wherein: the sealing member includes a first portion that seals a central portion of the main electrode, and has a first sealing surface opposite the cooling surface, and a second portion that seals the wiring portion to thereby surround the first portion in a plan view of the semiconductor device, and has a second sealing surface opposite the cooling surface; and a first thickness, which is a distance in a thickness direction of the semiconductor device from the cooling surface to the first sealing surface, is smaller than a second thickness, which is a distance in the thickness direction from the cooling surface to the second sealing surface.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described with reference to the accompanying drawings. In the following description, a "front surface" or an "upper surface" indicates an X-Y plane which faces the upper side (+Z direction) in a semiconductor device 1 of FIG. 1. Similarly, an "upside" indicates the upward direction (+Z direction) in the semiconductor device 1 of FIG. 1. A "back surface" or a "lower surface" indicates the X-Y plane which faces the lower side (−Z direction) in the semiconductor device 1 of FIG. 1. Similarly, a "downside" indicates the downward direction (−Z direction) in the semiconductor device 1 of FIG. 1. These terms mean the same directions as needed in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction. Furthermore, in the following description, a "main ingredient" indicates an ingredient contained at a rate of 80 volume percent (vol %) or more. In addition, "approximately equal" means that two objects are in the range of ±10%. Moreover, "perpendicular" or "parallel" means that an angle which one object forms with the other object is in the range of 90°±10° or 180°±10°.

First Embodiment

Figure 1:
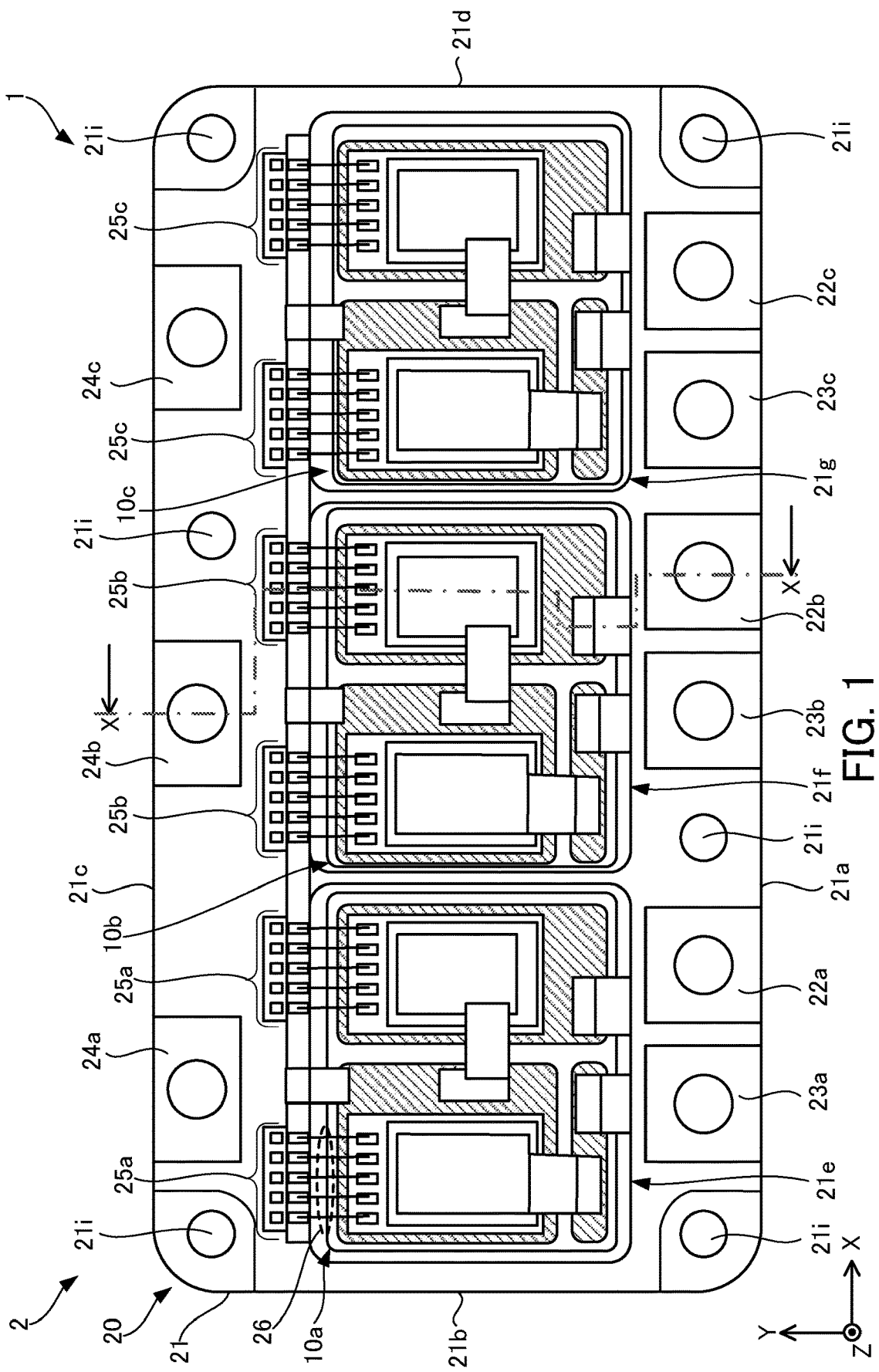
FIG. 1 is a plan view of a semiconductor device according to a first embodiment.
Figure 2:
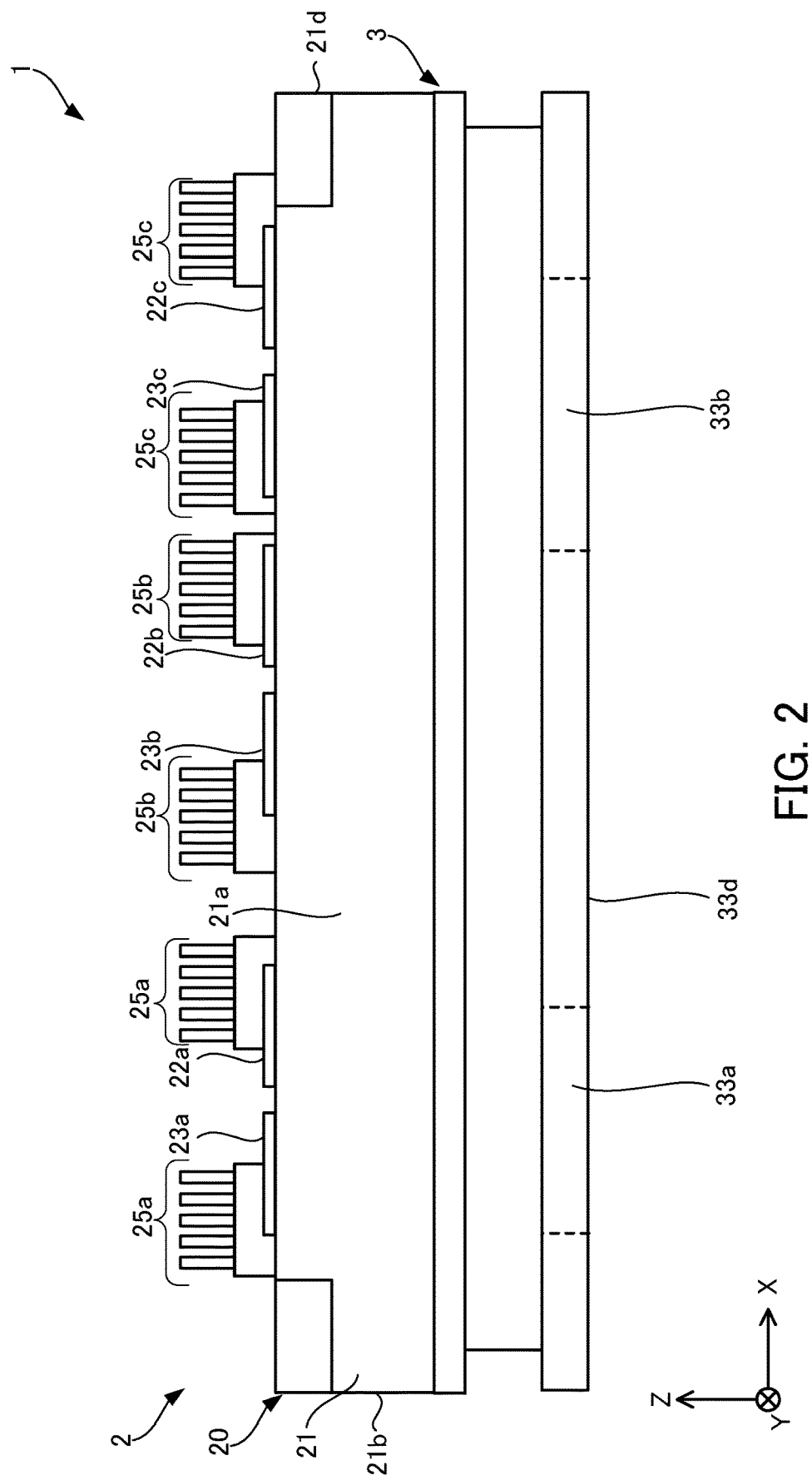
FIG. 2 is a side view of the semiconductor device according to the first embodiment.

A semiconductor device 1 according to a first embodiment will be described with reference to FIG. 1 and FIG. 2. FIG. 1 is a plan view of a semiconductor device according to a first embodiment. FIG. 2 is a side view of the semiconductor device according to the first embodiment. FIG. 2 is a side view obtained by viewing the X-Z plane in the +Y direction in FIG. 1.

A semiconductor device 1 includes a semiconductor module 2 and a cooler 3. Furthermore, the semiconductor module 2 includes semiconductor units 10a, 10b, and 10c and an enclosure 20 which houses the semiconductor units 10a, 10b, and 10c. The semiconductor units 10a, 10b, and 10c housed in the enclosure 20 are sealed with a sealing member 27 (not illustrated). Sealing with the sealing member 27 may be understood by referring to, for example, FIGS. 10 through 12. The semiconductor units 10a, 10b, and 10c have the same structure. If no distinctions are made among the semiconductor units 10a, 10b, and 10c, then description will be given as the semiconductor units 10. The details of the semiconductor units 10 will be described later.

First the enclosure 20 includes an outer frame 21, first connection terminals 22a, 22b, and 22c, second connection terminals 23a, 23b, and 23c, a U-phase output terminal 24a, a V-phase output terminal 24b, a W-phase output terminal 24c, and control terminals 25a, 25b, and 25c.

The outer frame 21 is approximately rectangular in plan view and is surrounded by outer walls 21a, 21b, 21c, and 21d on all sides. The outer walls 21a and 21c are long sides of the outer frame 21 and the outer walls 21b and 21d are short sides of the outer frame 21. Furthermore, each of corner portions at which the outer walls 21a, 21b, 21c, and 21d are connected to one another does not always have a right angle. As illustrated in FIG. 1, each corner portion may be R-chamfered. Fastening holes 21i which pierce the outer frame 21 are made in corner portions of the front surface of the outer frame 21. The fastening holes 21i are made in the corner portions of the outer frame 21 below the front surface of the outer frame 21.

The outer frame 21 includes unit housing portions 21e, 21f, and 21g in the front surface along the outer walls 21a and 21c. The unit housing portions 21e, 21f, and 21g are rectangular in plan view. The semiconductor units 10a, 10b, and 10c are housed in the unit housing portions 21e, 21f, and 21g, respectively. The outer frame 21 is fixed to the front surface of the cooler 3 over which the semiconductor units 10a, 10b, and 10c are arranged in the X direction. When the outer frame 21 is fixed to the front surface of the cooler 3, the unit housing portions 21e, 21f, and 21g of the outer frame 21 surround (house) the semiconductor units 10a, 10b, and 10c, respectively, arranged over the cooler 3. An inlet 33a and an outlet 33b are formed in a bottom 33d (opposite to the front surface to which the semiconductor units 10 are fixed) of the cooler 3. The details of the cooler 3 will be described later.

The outer frame 21 has in plan view the first connection terminals 22a, 22b, and 22c and the second connection terminals 23a, 23b, and 23c on the side of the outer wall 21a. One end portions of the first connection terminals 22a, 22b, and 22c and the second connection terminals 23a, 23b, and 23c are exposed on the side of the outer wall 21a. The other end portions of the first connection terminals 22a, 22b, and 22c and the second connection terminals 23a, 23b, and 23c are exposed in the unit housing portions 21e, 21f, and 21g and are electrically connected to the semiconductor units 10a, 10b, and 10c. Furthermore, the outer frame 21 has the U-phase output terminal 24a, the V-phase output terminal 24b, and the W-phase output terminal 24c on the side of the outer wall 21c. One end portions of the U-phase output terminal 24a, the V-phase output terminal 24b, and the W-phase output terminal 24c are exposed on the side of the outer wall 21c. The other end portions of the U-phase output terminal 24a, the V-phase output terminal 24b, and the W-phase output terminal 24c are exposed in the unit housing portions 21e, 21f, and 21g and are electrically connected to the semiconductor units 10a, 10b, and 10c.

In addition, the outer frame 21 houses nuts in lower portions of openings of the first connection terminals 22a, 22b, and 22c and the second connection terminals 23a, 23b, and 23c opposite the openings. Similarly, the outer frame 21 houses nuts in lower portions of openings of the U-phase output terminal 24a, the V-phase output terminal 24b, and the W-phase output terminal 24c opposite the openings.

Moreover, the outer frame 21 has the control terminals 25a, 25b, and 25c in plan view along sides in the +Y direction of the unit housing portions 21e, 21f, and 21g, respectively (along the outer wall 21c). The control terminals 25a arranged are divided into two groups. The control terminals 25b arranged are divided into two groups. The control terminals 25c arranged are divided into two groups. Each of the control terminals 25a, 25b, and 25c has the shape of the letter "J" (or the letter "U") and one end portions of the control terminals 25a, 25b, and 25c extend vertically upward (in the +Z direction) from the side of the outer wall 21c of the outer frame 21. The other end portions of the control terminals 25a, 25b, and 25c are exposed vertically upward (in the +Z direction) from the side of the outer wall 21c of the unit housing portions 21e, 21f, and 21g, respectively.

The above described outer frame 21 includes the first connection terminals 22a, 22b, and 22c, the second connection terminals 23a, 23b, and 23c, the U-phase output terminal 24a, the V-phase output terminal 24b, the W-phase output terminal 24c, and the control terminals 25a, 25b, and 25c and is integrally molded therewith by injection molding by the use of a thermoplastic resin such as polyphenylene sulfide resin, polybutylene terephthalate resin, polybutylene succinate resin, polyamide resin, or acrylonitrile butadiene styrene resin. By doing so, the enclosure 20 is formed.

Furthermore, the first connection terminals 22a, 22b, and 22c, the second connection terminals 23a, 23b, and 23c, the U-phase output terminal 24a, the V-phase output terminal 24b, the W-phase output terminal 24c, and the control terminals 25a, 25b, and 25c are made of metal, such as copper, aluminum, or an alloy containing at least one of them as a main ingredient, having good electrical conductivity. Plating treatment may be performed on the surfaces of the first connection terminals 22a, 22b, and 22c, the second connection terminals 23a, 23b, and 23c, the U-phase output terminal 24a, the V-phase output terminal 24b, the W-phase output terminal 24c, and the control terminals 25a, 25b, and 25c. At this time, nickel, a nickel-phosphorus alloy, a nickel-boron alloy, or the like is used as a plating material.

The sealing member 27 may be a thermosetting resin such as epoxy resin, phenolic resin, maleimide resin, or polyester resin. The sealing member 27 is preferably epoxy resin. In addition, a filler may be added to the sealing member 27. The filler is a ceramic having an insulating property and high thermal conductivity. The elastic modulus of the sealing member 27 is smaller than that of the cooler 3. The details of the sealing member 27 will be described later.

Figure 3:
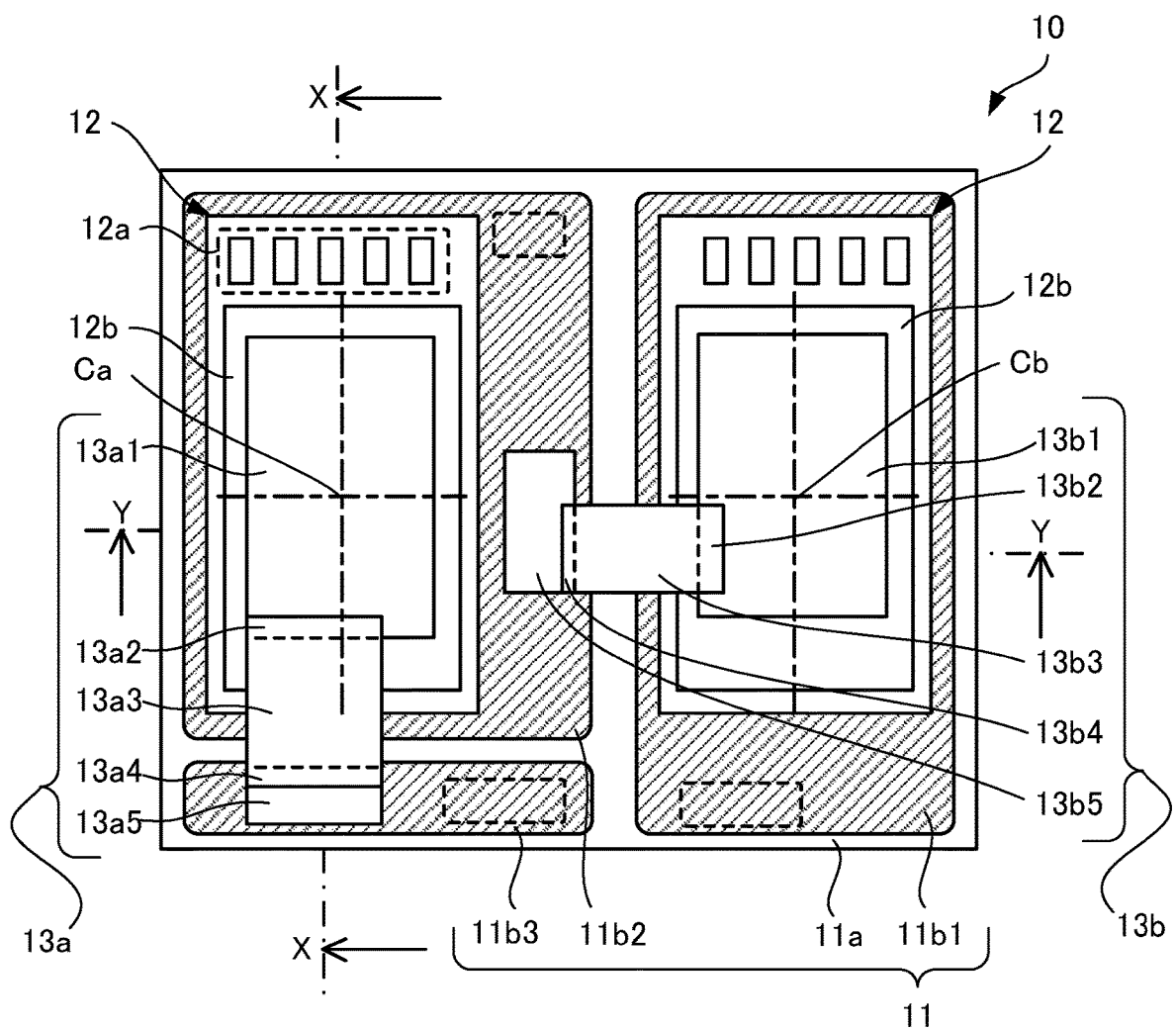
FIG. 3 is a plan view of a semiconductor unit included in the semiconductor device according to the first embodiment.
Figure 3:
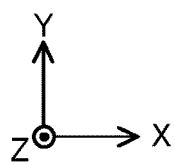
Figure 4:
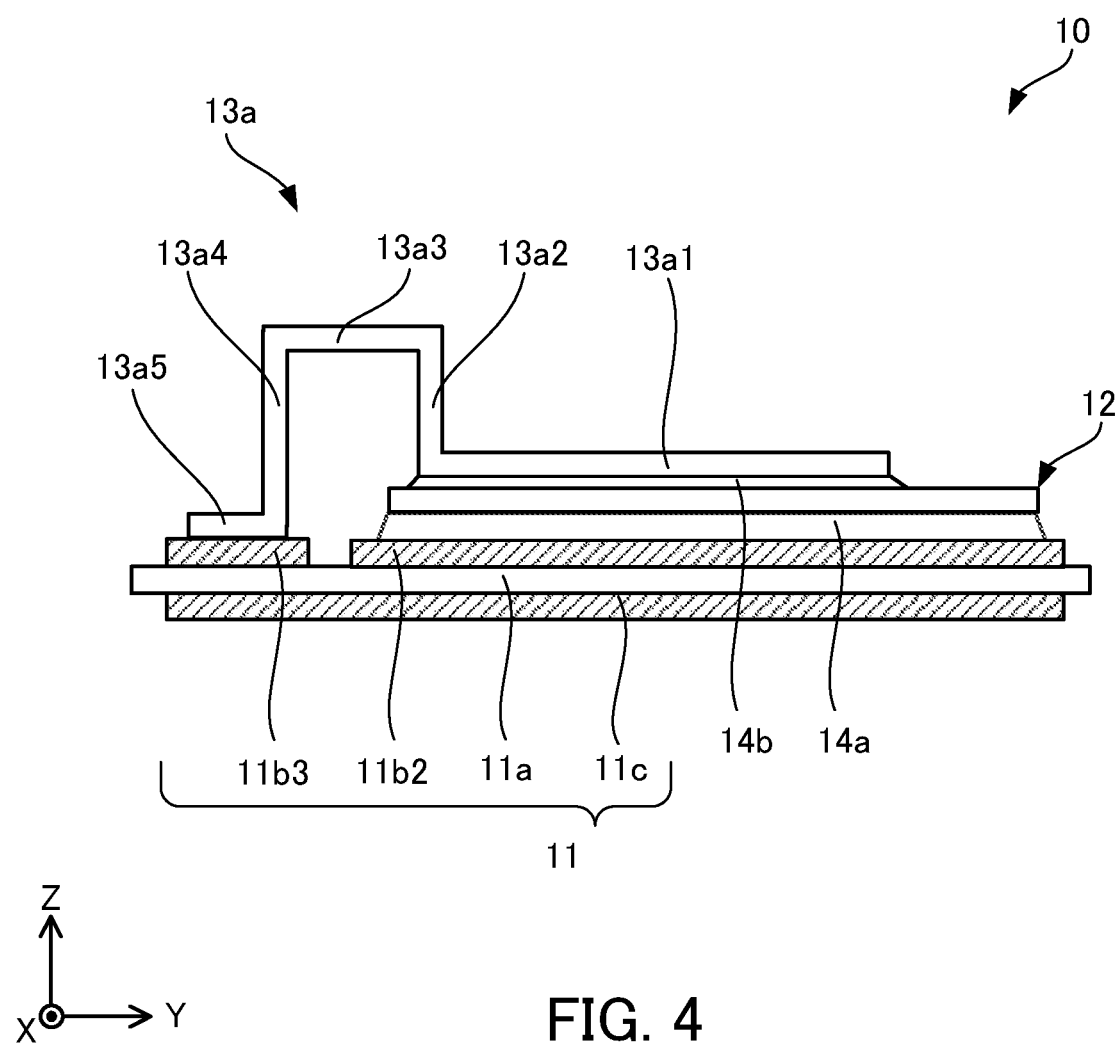
FIG. 4 is a sectional view of the semiconductor unit included in the semiconductor device according to the first embodiment (part 1)
Figure 5:
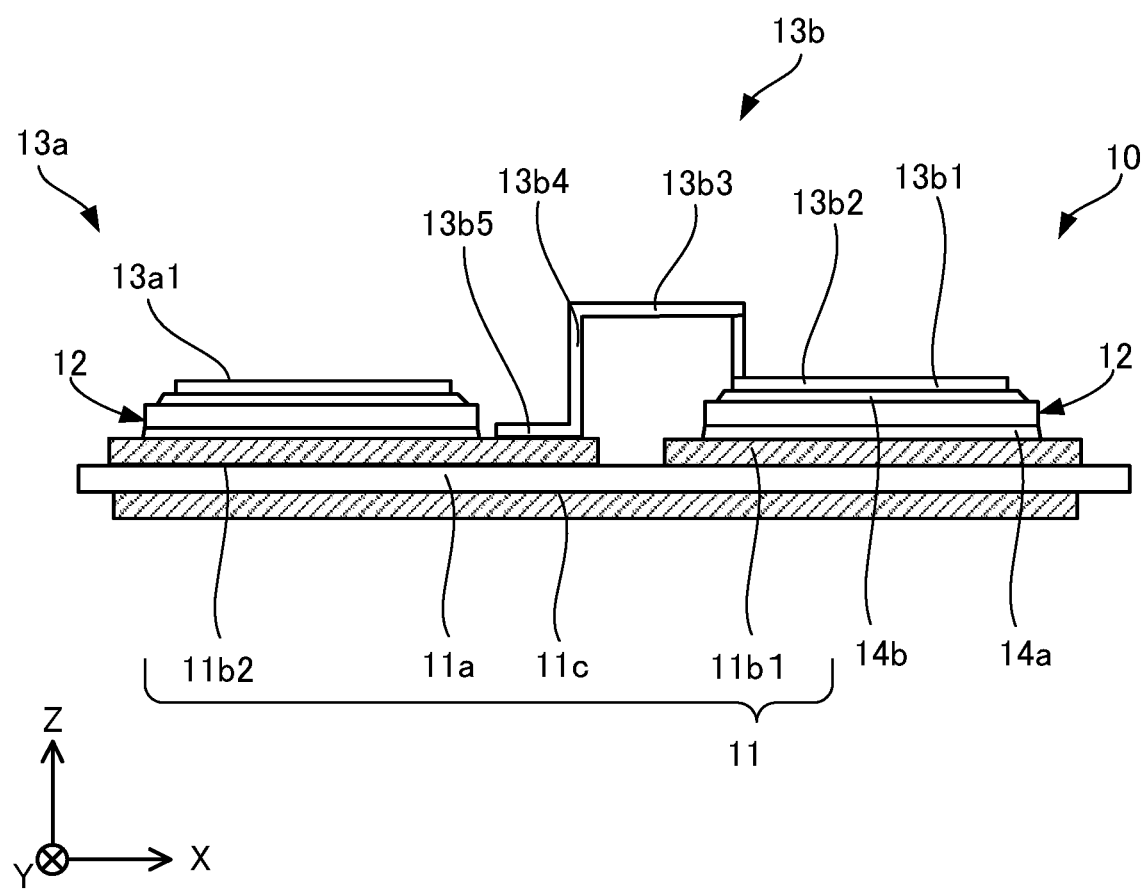
FIG. 5 is a sectional view of the semiconductor unit included in the semiconductor device according to the first embodiment (part 2)

The semiconductor units 10a, 10b, and 10c will now be described with reference to FIGS. 3 through 5. FIG. 3 is a plan view of a semiconductor unit included in the semiconductor device according to the first embodiment. FIGS. 4 and 5 are sectional views of the semiconductor unit included in the semiconductor device according to the first embodiment. FIG. 4 is a sectional view taken along the dot-dash line X-X of FIG. 3. FIG. 5 is a sectional view taken along the dot-dash line Y-Y of FIG. 3.

Each of the semiconductor units 10 includes an insulated circuit board 11, two semiconductor chips 12, and two lead frames 13a and 13b. The semiconductor chips 12 are bonded to the insulated circuit board 11 with a bonding member 14a. Furthermore, the lead frames 13a and 13b are bonded to main electrodes on the front surfaces of the semiconductor chips 12 with a bonding member 14b. The lead frames 13a and 13b may be bonded to the insulated circuit board 11 by ultrasonic bonding in place of the bonding member 14b.

The insulated circuit board 11 includes an insulating plate 11a, wiring boards 11b1, 11b2, and 11b3, and a metal plate 11c. The insulating plate 11a and the metal plate 11c are rectangular in plan view. Furthermore, corner portions of the insulating plate 11a and the metal plate 11c may be R-chamfered or C-chamfered. The size of the metal plate 11c is smaller in plan view than that of the insulating plate 11a and the metal plate 11c is formed inside the insulating plate 11a.

The insulating plate 11a has an insulating property and is made of a material, such as a ceramic, having high thermal conductivity. The linear expansion coefficient of the ceramic is larger than or equal to $3.0\times10^{-6}$/K and smaller than or equal to $10\times10^{-6}$/K. The elastic modulus of the ceramic is larger than or equal to 200 GPa and smaller than or equal to 400 GPa. The ceramic is aluminum oxide, aluminum nitride, silicon nitride, or the like.

The wiring boards 11b1, 11b2, and 11b3 are formed over the front surface of the insulating plate 11a. The wiring boards 11b1, 11b2, and 11b3 are made of metal having good electrical conductivity. The linear expansion coefficient of the wiring boards 11b1, 11b2, and 11b3 is larger than or equal to $16\times10^{-6}$/K and smaller than or equal to $18\times10^{-6}$/K. Furthermore, the elastic modulus of the wiring boards 11b1, 11b2, and 11b3 is larger than or equal to 50 GPa and smaller than or equal to 150 GPa. Such metal is copper, aluminum, an alloy containing at least one of them as a main ingredient, or the like. In addition, the thickness of the wiring boards 11b1, 11b2, and 11b3 is larger than or equal to 0.1 mm and smaller than or equal to 2.0 mm. In order to improve corrosion resistance, plating treatment may be performed on the surfaces of the wiring boards 11b1, 11b2, and 11b3. At this time, nickel, a nickel-phosphorus alloy, a nickel-boron alloy, or the like is used as a plating material.

The wiring board 11b1 occupies an area corresponding to half of the front surface of the insulating plate 11a on the side of a side in the +X direction and extending from a side in the −Y direction to a side in the +Y direction. End portions of the first connection terminals 22a, 22b, and 22c are bonded to an area in the wiring board 11b1 enclosed by a dashed line. At this time, the area in the wiring board 11b1 enclosed by the dashed line and the end portions of the first connection terminals 22a, 22b, and 22c may be bonded together via a conductive block body.

The wiring board 11b2 occupies an area corresponding to half of the front surface of the insulating plate 11a on the side of a side in the −X direction. Furthermore, the area occupied by the wiring board 11b2 extends from the side of the front surface of the insulating plate 11a in the +Y direction to this side of the side of the front surface of the insulating plate 11a in the −Y direction. End portions of the U-phase output terminal 24a, the V-phase output terminal 24b, and the W-phase output terminal 24c are bonded to an area in the wiring board 11b2 enclosed by a dashed line. The area in the wiring board 11b2 enclosed by the dashed line and the end portions of the U-phase output terminal 24a, the V-phase output terminal 24b, and the W-phase output terminal 24c may be bonded together with a conductive block body therebetween.

The wiring board 11b3 occupies an area on the front surface of the insulating plate 11a enclosed by the wiring boards 11b1 and 11b2. The end portions of the first connection terminals 22a, 22b, and 22c are bonded to an area in the wiring board 11b3 enclosed by a dashed line. The area in the wiring board 11b3 enclosed by the dashed line and the end portions of the first connection terminals 22a, 22b, and 22c may be bonded together with a conductive block body therebetween.

The above wiring boards 11b1, 11b2, and 11b3 are formed in the following way on the front surface of the insulating plate 11a. A metal layer is formed on the front surface of the insulating plate 11a and treatment, such as etching, is performed on the metal layer. By doing so, the wiring boards 11b1, 11b2, and 11b3 each having a determined shape is obtained. Alternatively, the wiring boards 11b1, 11b2, and 11b3 cut in advance out of a metal plate may be pressure-bonded to the front surface of the insulating plate 11a. The wiring boards 11b1, 11b2, and 11b3 are taken as an example. The number, shape, size, or position of wiring boards may be properly selected as needed.

The metal plate 11c is formed on the back surface of the insulating plate 11a. The metal plate 11c is rectangular. The area of the metal plate 11c is smaller in plan view than that of the insulating plate 11a and is larger in plan view than the total area of the wiring boards 11b1, 11b2, and 11b3. The corner portions of the metal plate 11c may be R-chamfered or C-chamfered. The size of the metal plate 11c is smaller than that of the insulating plate 11a and is formed on the entire back surface except an edge portion of the insulating plate 11a. The metal plate 11c contains as a main ingredient metal having high thermal conductivity. The linear expansion coefficient of the metal plate 11c is larger than or equal to $16 \times 10^{-6}$/K and smaller than or equal to $18 \times 10^{-6}$/K. Furthermore, the elastic modulus of the metal plate 11c is larger than or equal to 50 GPa and smaller than or equal to 150 GPa. Such metal is copper, aluminum, an alloy containing at least one of them, or the like.

A direct copper bonding (DCB) substrate, an active metal brazed (AMB) substrate, or the like may be used as the insulated circuit board 11 having the above structure. The insulated circuit board 11 may be fixed to the front surface of the cooler 3 with a bonding member (not illustrated) therebetween. Heat generated by the semiconductor chips 12 is conducted to the cooler 3 via the wiring boards 11b1 and 11b2, the insulating plate 11a, and the metal plate 11c. By doing so, the heat is dissipated.

The bonding members 14a and 14b are solder. Pb-free solder is used as the solder. The Pb-free solder contains as a main ingredient an alloy containing at least two of tin, silver, copper, zinc, antimony, indium, bismuth, and the like. Furthermore, the solder may contain an additive such as nickel, germanium, cobalt, or silicon. The solder containing an additive improves wettability, a gloss, and bonding strength and reliability is improved.

In addition, a brazing filler metal or a thermal interface material may be used as a bonding member (not illustrated) for bonding the semiconductor units 10 and the cooler 3 together. The brazing filler metal contains as a main ingredient at least one of an aluminum alloy, a titanium alloy, a magnesium alloy, a zirconium alloy, a silicon alloy, and the like. The thermal interface material is an adhesive containing an elastomer sheet, room temperature vulcanization (RTV) rubber, gel, a phase change material, or the like. By fixing the semiconductor units 10 to the cooler 3 with the brazing filler metal or the thermal interface material therebetween, the heat dissipation property of the semiconductor units 10 is improved.

Each semiconductor chip 12 includes a power device element made of silicon. For example, the thickness of each semiconductor chip 12 is larger than or equal to 40 μm and smaller than or equal to 250 μm. The linear expansion coefficient of the semiconductor chips 12 included in the semiconductor device 1 is smaller than that of the sealing member 27 and the cooler 3. The power device element is a reverse conducting (RC)-insulated gate bipolar transistor (IGBT). The RC-IGBT has both of the function of an IGBT, which is a switching element, and the function of a free wheeling diode (FWD), which is a diode element. In this case, each semiconductor chip 12 has on the front surface a control electrode 12a (gate electrode) and an output electrode (emitter electrode), which is a main electrode 12b. Each semiconductor chip 12 has on the back surface an input electrode (collector electrode), which is a main electrode. The control electrode 12a is located along (or in a central portion on) the side of a side of the front surface of each semiconductor chip 12. The output electrode is located in a central portion of the front surface of each semiconductor chip 12.

In addition, each semiconductor chip 12 may use a switching element and a diode element in place of the RC-IGBT. The switching element is an IGBT, a power metal oxide semiconductor field effect transistor (MOSFET), or the like. In this case, for example, each semiconductor chip 12 has on the back surface an input electrode (drain electrode or a collector electrode) as a main electrode and has on the front surface the control electrode 12a (gate electrode) and an output electrode (source electrode or an emitter electrode), which is the main electrode 12b. The diode element is an FWD such as a Schottky barrier diode (SBD) or a P-intrinsic-N (PiN) diode. In this case, each semiconductor chip 12 has on the back surface an output electrode (cathode electrode) as a main electrode and has on the front surface input electrode (anode electrode) as a main electrode.

In addition, each semiconductor chip 12 may include a power MOSFET as the switching element. In this case, each semiconductor chip 12 has on the front surface the control electrode 12a (gate electrode) and an output electrode (source electrode), which is the main electrode 12b. Each semiconductor chip 12 has on the back surface an input electrode (drain electrode), which is a main electrode. Each semiconductor chip 12 may preferably be made of silicon carbide.

The lead frames 13a and 13b electrically connect the semiconductor chips 12 and the wiring boards 11b1, 11b2, and 11b3. Each of the semiconductor units 10 may be an inverter circuit corresponding to one phase. The lead frame 13a directly connects the main electrode 12b of the semiconductor chip 12 (over the wiring board 11b2) and the wiring board 11b3. The lead frame 13b directly connects the main electrode 12b of the semiconductor chip 12 (over the wiring board 11b1) and the wiring board 11b2.

The lead frames 13a and 13b integrally include main electrode bonding portions 13a1 and 13b1, first vertical connecting portions 13a2 and 13b2, horizontal connecting portions 13a3 and 13b3, second vertical connecting portions 13a4 and 13b4, and wiring bonding portions 13a5 and 13b5, respectively. Each of the lead frames 13a and 13b as a whole has the same thickness and has the shape of a flat plate. Each of the lead frames 13a and 13b may be formed by bending each portion. The lead frames 13a and 13b are made of metal, such as copper, aluminum, or an alloy containing at least one of them as a main ingredient, having good electrical conductivity. In addition, the thickness of the lead frames 13a and 13b is larger than or equal to 0.3 mm and smaller than or equal to 2.0 mm. In order to improve corrosion resistance, plating treatment may be performed on the surfaces of the lead frames 13a and 13b. At this time, nickel, a nickel-phosphorus alloy, a nickel-boron alloy, or the like is used as a plating material.

Each of the main electrode bonding portions 13a1 and 13b1 has the shape of a flat plate. The main electrode bonding portions 13a1 and 13b1 are bonded to at least central portions Ca and Cb of the main electrodes 12b of the semiconductor chips 12 (over the wiring boards 11b2 and 11b1, respectively) with the bonding member 14a. The main electrode bonding portions 13a1 and 13b1 are rectangular in plan view. This is the same with the main electrodes 12b. The area of the main electrode bonding portions 13a1 and 13b1 may be larger than or equal to 30 percent of the area of the main electrodes 12b and smaller than or equal to 80 percent of the area of the main electrodes 12b in plan view.

Accordingly, there are spaces in plan view between outer peripheral portions of the main electrode bonding portions 13a1 and 13b1 and outer peripheral portions of the main electrodes 12b.

Lower end portions of the first vertical connecting portions 13a2 and 13b2 are integrally connected to end portions of the main electrode bonding portions 13a1 and 13b1, respectively, and upper end portions of the first vertical connecting portions 13a2 and 13b2 extend vertically upward (in the +Z direction) with respect to the main electrode bonding portions 13a1 and 13b1, respectively. The first vertical connecting portion 13a2 is bonded to an end portion on the side of the wiring board 11b3 (in the −Y direction) of the main electrode bonding portion 13a1 bonded to the semiconductor chip 12. The first vertical connecting portion 13b2 is bonded to an end portion on the side of the wiring board 11b2 (in the −X direction) and in the −Y direction of the main electrode bonding portion 13b1 bonded to the semiconductor chip 12.

The horizontal connecting portions 13a3 and 13b3 are integrally connected to the upper end portions of the first vertical connecting portions 13a2 and 13b2, respectively, and extend to upsides of the wiring boards 11b3 and 11b2, respectively. At this time, the horizontal connecting portions 13a3 and 13b3 extend over a gap between the wiring boards 11b2 and 11b3 and a gap between the wiring boards 11b1 and 11b2, respectively. The horizontal connecting portions 13a3 and 13b3 are parallel to the insulated circuit board 11. Furthermore, the height of the horizontal connecting portions 13a3 and 13b3 may be the same. The height of the first vertical connecting portions 13a2 and 13b2 and the second vertical connecting portions 13a4 and 13b4 is properly selected according to the height of the horizontal connecting portions 13a3 and 13b3.

Upper end portions of the second vertical connecting portions 13a4 and 13b4 are integrally connected to end portions of the horizontal connecting portions 13a3 and 13b3, respectively. Lower end portions of the second vertical connecting portions 13a4 and 13b4 extend vertically downward (in the −Z direction) and are integrally connected to the wiring bonding portions 13a5 and 13b5, respectively.

The wiring bonding portions 13a5 and 13b5 are bonded to the wiring boards 11b3 and 11b2, respectively, and are integrally connected to the lower end portions of the second vertical connecting portions 13a4 and 13b4, respectively. The wiring bonding portions 13a5 and 13b5 may be bonded to the wiring boards 11b3 and 11b2, respectively, with the above bonding member or by ultrasonic bonding.

The first vertical connecting portion 13a2, the horizontal connecting portion 13a3, the second vertical connecting portion 13a4, and the wiring bonding portion 13a5 of the lead frame 13a have the same width. This width corresponds to length in a direction (in the ±X direction) perpendicular to the wiring direction (±Y direction) of the lead frame 13a. The first vertical connecting portion 13b2, the horizontal connecting portion 13b3, and the second vertical connecting portion 13b4 of the lead frame 13b have the same width. This width corresponds to length in a direction (in the ±Y direction) perpendicular to the wiring direction (±X direction) of the lead frame 13b.

Furthermore, the control electrodes 12a of the semiconductor chips 12 of the semiconductor units 10a, 10b, and 10c housed in the unit housing portions 21e, 21f, and 21g of the enclosure 20 are connected mechanically and electrically to the other end portions of the control terminals 25a, 25b, and 25c, respectively, by wires 26. Each wire 26 contains as a main ingredient a material, such as gold, copper, aluminum, or an alloy containing at least one of them, having good electrical conductivity. Each wire 26 is preferably an aluminum alloy containing a very small amount of silicon. In addition, for example, the diameter of the wires 26 is larger than or equal to 100 μm and smaller than or equal to 400 μm.

Figure 6:
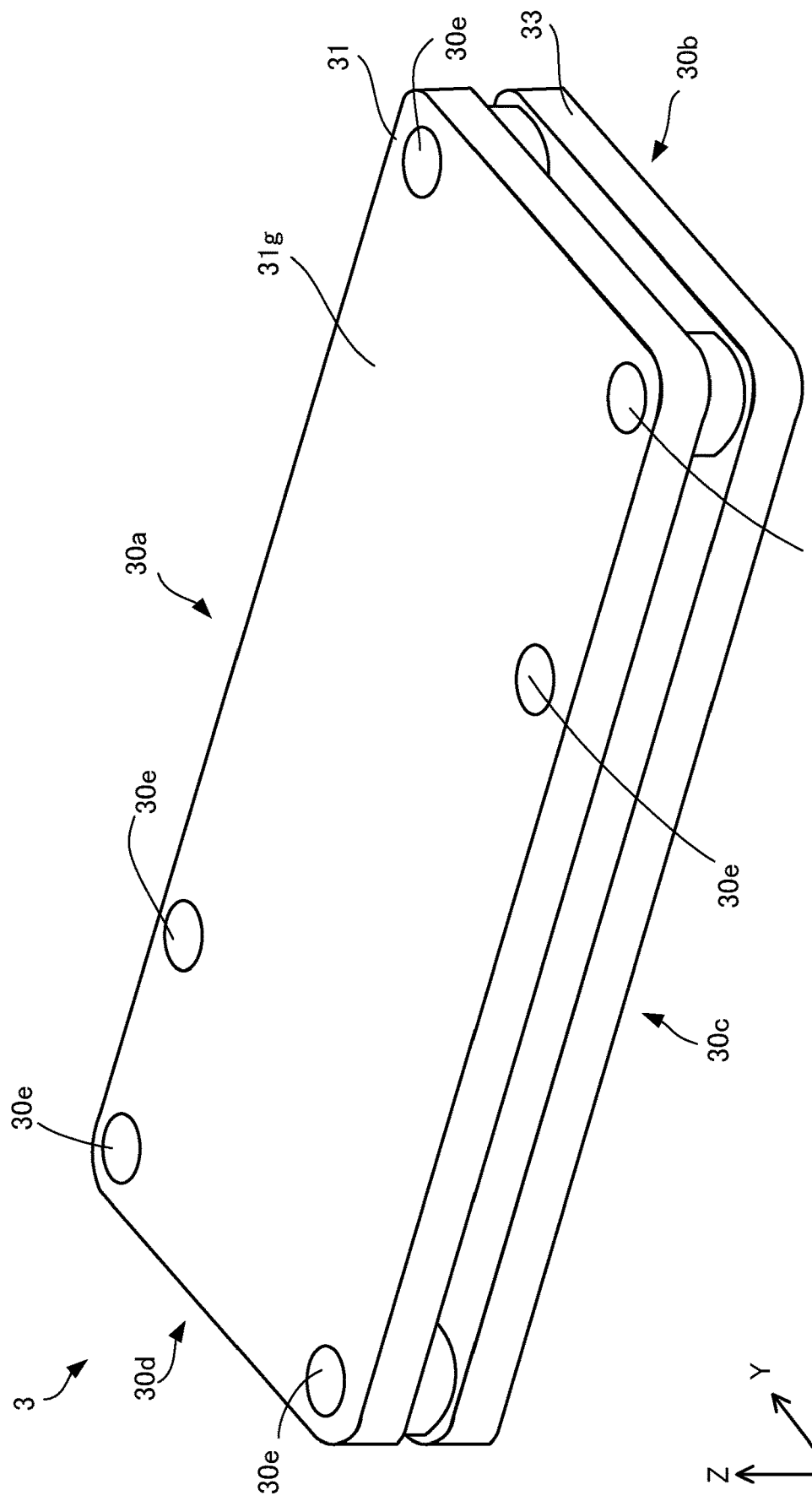
FIG. 6 is a perspective view of a cooler included in the semiconductor device according to the first embodiment (part 1)
Figure 7:
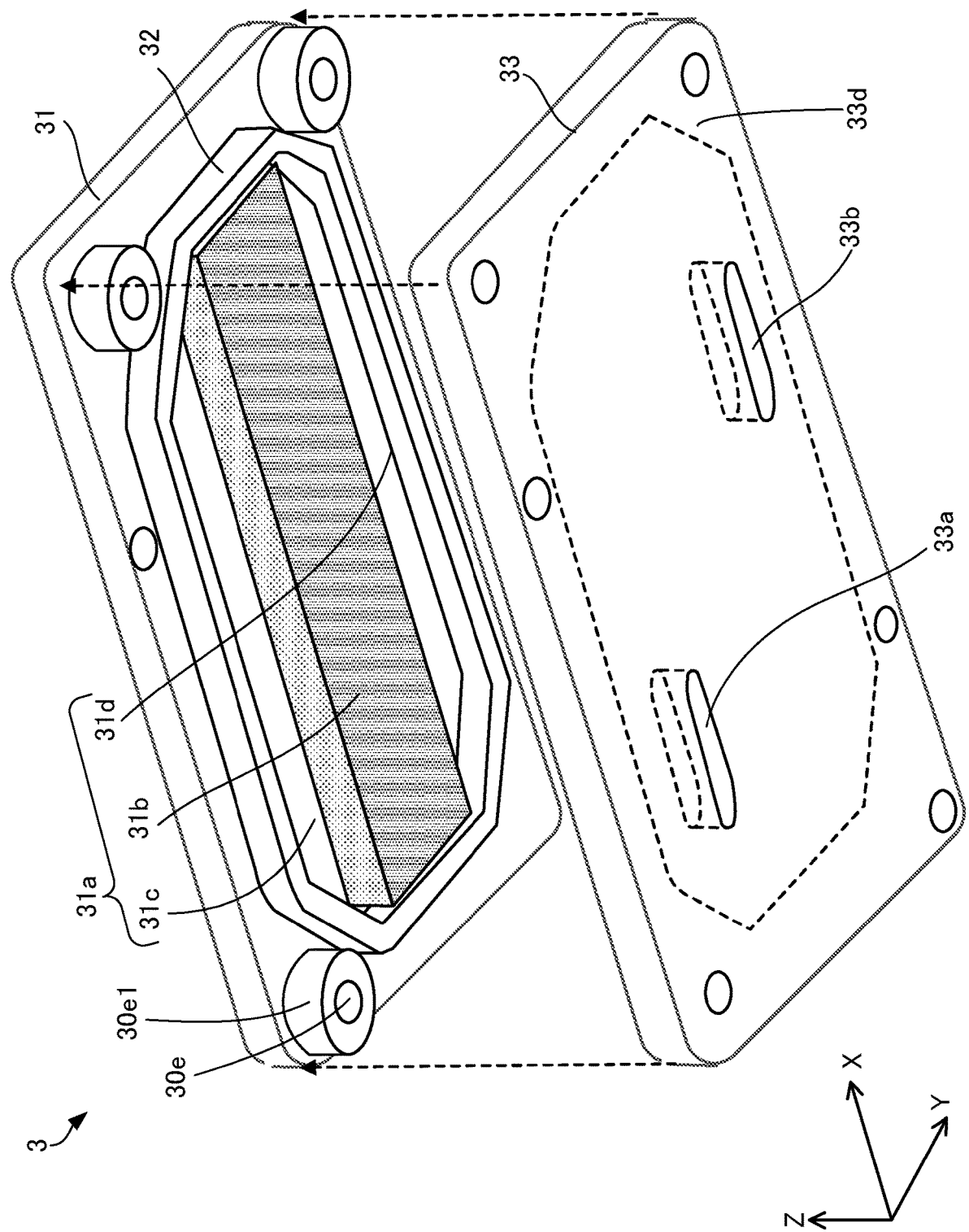
FIG. 7 is a perspective view of a cooler included in the semiconductor device according to the first embodiment (part 2)
Figure 8:
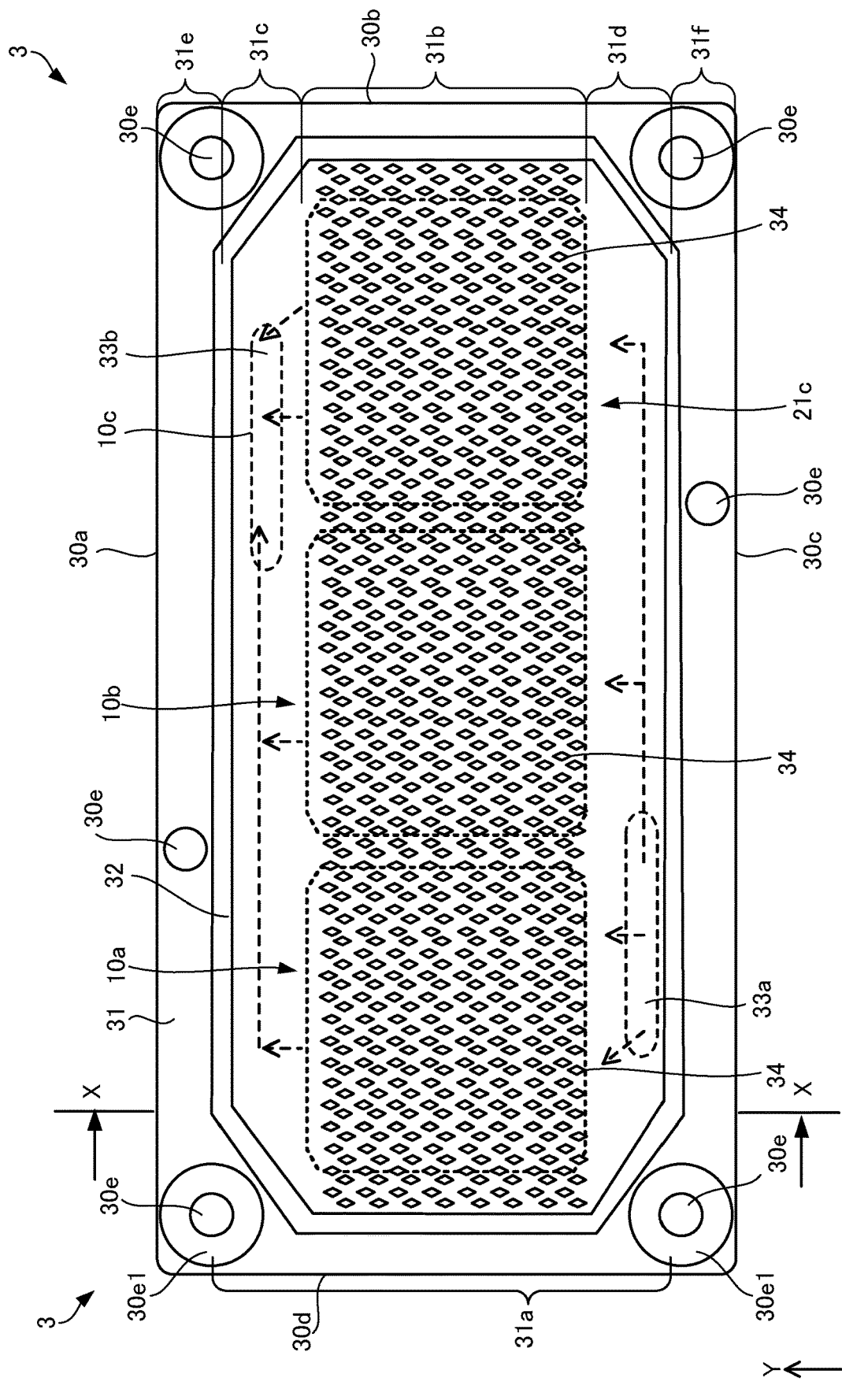
FIG. 8 is a plan view of the inside of the cooler included in the semiconductor device according to the first embodiment.

The cooler 3 will now be described with reference to FIGS. 6 through 8. FIGS. 6 and 7 are perspective views of the cooler included in the semiconductor device according to the first embodiment. FIG. 8 is a plan view of the inside of the cooler included in the semiconductor device according to the first embodiment. FIG. 7 is a perspective view of the back surface side of a top plate 31 of the cooler 3. FIG. 8 transparently illustrates, in plan view, the configuration of the back surface of the top plate 31 of the cooler 3.

The cooler 3 has the inlet 33a from which a refrigerant flows into the inside and the outlet 33b from which the refrigerant flowing through the inside flows out to the outside. The cooler 3 cools the semiconductor units by making heat generated by the semiconductor units 10 flow out through the refrigerant. Water, antifreeze (ethylene glycol aqueous solution), long life coolant (LLC), or the like is used as the refrigerant.

The cooler 3 has in plan view a rectangular shape including long sides 30a and 30c and short sides 30b and 30d. Furthermore, fastening holes 30e which pierce at least the four corners of the cooler 3 are made in plan view.

The semiconductor units 10a, 10b, and 10c are mounted over a central portion of the front surface of the cooler 3 along the long sides 30a and 30c (in the +X direction). In FIG. 8, areas over which the semiconductor units 10a, 10b, and 10c are arranged are indicated by dashed lines. The number of the semiconductor units 10 is not limited to three. Furthermore, if the semiconductor units are arranged over a central portion (cooling area described later) of the cooler 3, then the arrangement position or the size of the semiconductor units 10 is not limited to the case of this embodiment. In addition, the cooler 3 may include a pump and a radiator. The pump makes the refrigerant flow into the inlet 33a of the cooler 3 and makes again the refrigerant flowing out from the outlet 33b flow into the inlet 33a. By doing so, the pump circulates the refrigerant. The radiator dissipates to the outside heat conduct from the semiconductor units 10 to the refrigerant.

The cooler 3 includes the top plate 31, a side wall 32 circularly connected to the back surface of the top plate 31, and a cooling bottom plate 33 located opposite the top plate 31 and connected to the back surface of the side wall 32. The top plate 31 has a rectangular shape surrounded in plan view by the long sides 30a and 30c and the short sides 30b and 30d on all sides. The fastening holes 30e are made in the four corners of the top plate 31. Corner portions of the top plate 31 may be R-chamfered in plan view.

Furthermore, as illustrated in FIG. 8, the top plate 31 is divided into a flow path area 31a and outer edge areas 31e and 31f. As described later, the side wall 32 is connected to the back surface of the top plate 31. The flow path area 31a is surrounded by the side wall 32. The flow path area 31a is divided further into a cooling subarea 31b and communicating subareas 31c and 31d parallel to the long sides 30a and 30c. The cooling subarea 31b is parallel to the long sides 30a and 30c of the top plate 31 (extends in the longitudinal direction of the top plate 31), is situated in the center of the top plate 31, and is rectangular. The semiconductor units 10 are arranged in line in the X direction over the cooling subarea 31b of a cooling surface 31g, which is the front surface of the top plate 31. There is no level difference in the thickness direction (in the Z direction) on the cooling surface 31g of the top plate 31 over which the semiconductor units 10 are mounted. That is to say, the cooling surface 31g of the top plate 31 is a flat surface and forms the same plane.

Figure 9:
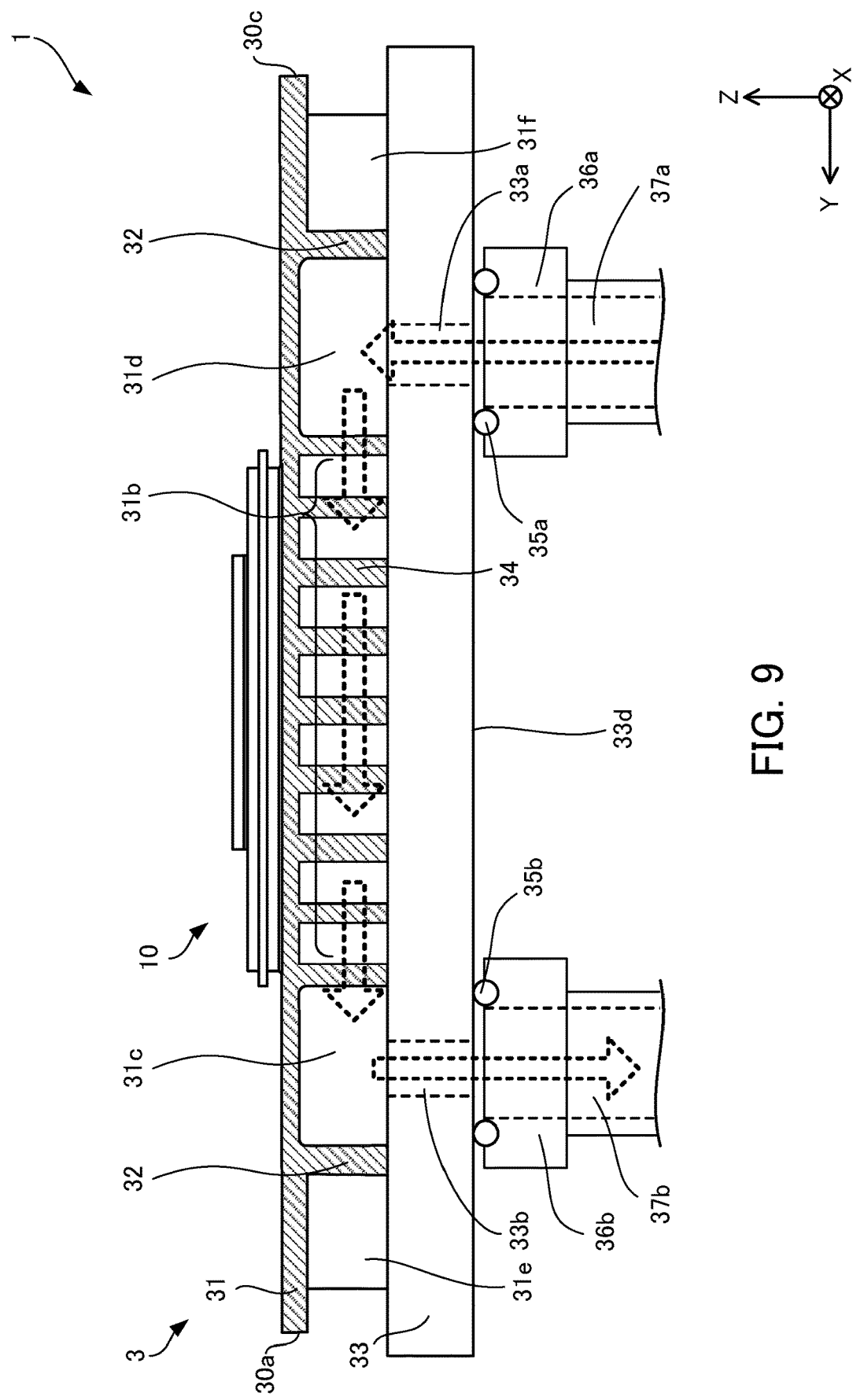
FIG. 9 is a view for describing the flow of a refrigerant in the cooler included in the semiconductor device according to the first embodiment.

A plurality of radiation fins 34 are formed in the cooling subarea 31b on the back surface of the top plate 31. For example, the thickness (length in the Z direction) of the top plate 31 is larger than or equal to 0.5 mm and smaller than or equal to 5.0 mm. The plurality of radiation fins 34 extend so as to connect the cooling subarea 31b on the back surface of the top plate 31 and the cooling bottom plate 33. The height (length in the Z direction) of the plurality of radiation fins 34 is larger than or equal to 1.5 mm and smaller than or equal to 15.0 mm. The height of the plurality of radiation fins 34 is preferably larger than or equal to 2.0 mm and smaller than or equal to 12.0 mm. FIG. 8 illustrates the plurality of radiation fins 34 in plan view and FIG. 9 illustrates the side of each radiation fin 34. However, FIG. 8 schematically illustrates the plurality of radiation fins 34 and each radiation fin 34 in FIG. 8 does not always match each radiation fin 34 in FIG. 9. In the cooling subarea 31b, the number of radiation fins 34 arranged in the direction of the long sides 30a and 30c is larger than that of radiation fins 34 arranged in the direction of the short sides 30b and 30d. The cooling subarea 31b includes portions on which the radiation fins 34 are located and flow paths between the radiation fins 34. The distance between adjacent radiation fins 34 may be shorter than the width of each radiation fin 34 itself. Each radiation fin 34 has an upper end and a lower end in the ±Z direction. An upper end of each radiation fin 34 is connected thermally and mechanically to the back surface of the top plate 31. A lower end of each radiation fin 34 is connected thermally and mechanically to the front surface of the cooling bottom plate 33 (inside the cooler 3). The upper end of each radiation fin 34 and the top plate 31 may be integrally formed. That is to say, each radiation fin 34 may integrally protrude in the −Z direction from the back surface of the top plate 31. On the other hand, the lower end of each radiation fin 34 may adhere to the front surface of the cooling bottom plate 33 (inside the cooler 3) by brazing or the like. Furthermore, a direction in which each radiation fin 34 extends is approximately perpendicular to a principal plane of each of the top plate 31 and the cooling bottom plate 33. Each radiation fin 34 may be a pin fin. Furthermore, a section of each radiation fin 34 parallel to the principal plane of the top plate 31 is rectangular. In FIG. 8, a section of each radiation fin 34 parallel to the principal plane of the top plate 31 is rhombic. As a result, the surface area of each radiation fin 34 which is in contact with the refrigerant is large compared with a case where a section of each radiation fin 34 parallel to the principal plane of the top plate 31 is circular. This enhances heat radiation efficiency.

In addition, the plurality of radiation fins 34 may be arranged in the cooling subarea 31b of the cooling surface 31g of the top plate 31 so that when the refrigerant flows into the cooling subarea 31b, any side of the rectangle will not be perpendicular to a main direction in which the refrigerant flows in the cooling subarea 31b. In this embodiment, a main direction in which the refrigerant flows in the cooling subarea 31b is the Y direction (parallel to the short sides 30b and 30d). The plurality of radiation fins 34 are arranged in the cooling subarea 31b so that any side of the rectangle will not be perpendicular to the Y direction. More specifically, the plurality of radiation fins 34 are arranged so that any side of the rectangle will not be perpendicular to the Y direction, so that one diagonal of the rectangle will be parallel to the X direction (parallel to the long sides 30a and 30c), and so that the other diagonal of the rectangle will be parallel to the Y direction. Alternatively, the plurality of radiation fins 34 may be arranged so that any side of the rectangle will not be perpendicular to the Y direction, so that one diagonal of the rectangle will be inclined with respect to the X direction, and so that the other diagonal of the rectangle will be inclined with respect to the Y direction. By adopting any of the above methods, loss of the flow velocity of the refrigerant flowing in the cooling subarea 31b is reduced, compared with a case where the plurality of radiation fins 34 are arranged in the cooling subarea 31b so that any side of the above rectangle will be perpendicular to the above flow direction. This enhances heat radiation efficiency.

In addition, each radiation fin 34 has the shape of a rhombus on the X-Y plane illustrated in FIG. 8. The length of the rhombus in the direction of the long sides 30a and 30c is shorter than the length of the rhombus in the direction of the short sides 30b and 30d. A section of each radiation fin 34 may be polygonal. For example, a section of each radiation fin 34 may be square. Furthermore, a section of each radiation fin 34 may be circular. For example, a section of each radiation fin 34 may be round. Moreover, the plurality of radiation fins 34 may be arranged in the cooling subarea 31b so as to form a determined pattern. As illustrated in FIG. 8, the plurality of radiation fins 34 are arranged in zigzag. The plurality of radiation fins 34 may be arranged squarely in the cooling subarea 31b.

The communicating subareas 31c and 31d are adjacent to both sides of the cooling subarea 31b on the cooling surface 31g of the top plate 31 and spread along the cooling subarea 31b. Accordingly, the communicating subareas 31c and 31d spread from the cooling subarea 31b to the side wall 32 (on the sides of the long sides 30a and 30c, respectively). In the case of FIG. 8, each of the communicating subareas 31c and 31d is trapezoidal. For example, each of the communicating subareas 31c and 31d may be rectangular or semicircular or have the shape of a mountain having a plurality of peaks, depending on an area surrounded by the side wall 32. Furthermore, corner portions of the communicating subareas 31c and 31d may be R-chamfered in plan view so as to have curvature. In this case, joints of the side wall 32 which demarcates the communicating subareas 31c and 31d are R-chamfered. The refrigerant flowing in the communicating subareas 31c and 31d does not stay at the smooth corner portions and flows easily. This prevents corrosion at the corner portions. Furthermore, the communicating subareas 31c and 31d do not always have a symmetrical shape. Moreover, the outlet 33b and the inlet 33a correspond to the communicating subareas 31c and 31d, respectively, and are formed near the short sides 30d and 30b, respectively. Details will be described later. In addition, the outlet 33b and the inlet 33a are formed in central portions in the Y direction of the communicating subareas 31c and 31d, respectively. The communicating subarea 31c or 31d may have a shape which is such that the refrigerant easily flows out from the outlet 33b or easily flows in from the inlet 33a. For example, in order to drive the refrigerant into the outlet 33b, the communicating subarea 31c may become narrower as it approaches the outlet 33b.

The outer edge areas 31e and 31f are outside the flow path area 31a (cooling subarea 31b and the communicating subareas 31c and 31d) of the top plate 31. That is to say, the outer edge areas 31e and 31f spread in plan view from the side wall 32 of the top plate 31 to outer edges of the top plate 31. The above described fastening holes 30e and fastening reinforcing portions 30e1 are formed in the outer edge areas 31e and 31f.

The side wall 32 is circularly formed on the back surface of the top plate 31 so as to surround the cooling subarea 31*b* and the communicating subareas 31*c* and 31*d*. An upper end in the +Z direction of the side wall 32 adheres to the back surface of the top plate 31. Furthermore, a lower end in the −Z direction of the side wall 32 adheres to the front surface of the cooling bottom plate 33. In the case of FIG. 8, the side wall 32 has eight sides including sides along the cooling subarea 31*b* parallel to the short sides 30*b* and 30*d*, sides along the communicating subareas 31*c* and 31*d* parallel to the long sides 30*a* and 30*c*, and sides which connect them. Corner portion at the joints inside the circular side wall 32 may be R-chamfered. As long as the side wall 32 includes in plan view the rectangular cooling subarea 31*b* and the communicating subareas 31*c* and 31*d* on both sides of the cooling subarea 31*b*, there is no need for the side wall 32 to include six sides. In addition, the height (length in the Z direction) of the side wall 32 corresponds to the height of the plurality of radiation fins 34 and is, for example, larger than or equal to 1.5 mm and smaller than or equal to 15.0 mm. The height of the side wall 32 is preferably larger than or equal to 2.0 mm and smaller than or equal to 12.0 mm. Moreover, as described later, the side wall 32 put between the top plate 31 and the cooling bottom plate 33 has thickness (length in the Y direction) which is such that the strength of the cooler 3 is maintained and such that cooling performance does not deteriorate. For example, the thickness of the side wall 32 is larger than or equal to 1.0 mm and smaller than or equal to 3.0 mm.

Furthermore, the fastening reinforcing portions 30*e*1 may be formed around the fastening holes 30*e* on the back surface of the top plate 31 (inside the cooler 3). A through hole corresponding to a fastening hole 30*e* is made in each fastening reinforcing portion 30*e*1. The fastening reinforcing portions 30*e*1 are screw frames. The side wall 32 is put between the top plate 31 and the cooling bottom plate 33 and maintains the strength of the cooler 3. Accordingly, the height of the fastening reinforcing portions 30*e*1 is approximately the same as that of the side wall 32. The width (length in the radial direction from the center of the fastening holes 30*e* in plan view) of the fastening reinforcing portions 30*e*1 is larger than or equal to 0.7 times the diameter of the fastening holes 30*e* and smaller than or equal to 2.0 times the diameter of the fastening holes 30*e*.

The cooling bottom plate 33 has the shape of a flat plate and the shape of the cooling bottom plate 33 is the same in plan view as that of the top plate 31. That is to say, the cooling bottom plate 33 is rectangular and is surrounded in plan view by long sides and short sides on all sides. Fastening holes corresponding to the top plate 31 are made in the four corners of the cooling bottom plate 33. Furthermore, corner portions of the cooling bottom plate 33 may also be R-chamfered. In addition, with the cooling bottom plate 33, the front surface and a bottom 33*d* are parallel to each other. Alternatively, the front surface and the bottom 33*d* of the cooling bottom plate 33 may be opposed to the areas over which the semiconductor units 10*a*, 10*b*, and 10*c* are arranged. In this embodiment, there is no level difference on the bottom 33*d* of the cooling bottom plate 33. That is to say, the bottom 33*d* of the cooling bottom plate 33 is a flat surface and forms the same plane. In addition, the bottom 33*d* of the cooling bottom plate 33 and the cooling surface 31*g* of the top plate 31 may also be parallel to each other. The inlet 33*a* from which the refrigerant flows in and the outlet 33*b* from which the refrigerant flows out are formed in the bottom 33*d* of the cooling bottom plate 33. A seal area is set around each of the inlet 33*a* and the outlet 33*b* in the bottom 33*d* of the cooling bottom plate 33. The seal areas continuously surround the peripheries of the inlet 33*a* and the outlet 33*b*. The inlet 33*a* corresponds to the communicating subarea 31*d* and is formed on the side of the long side 30*c* and the short side 30*b*. The outlet 33*b* corresponds to the communicating subarea 31*c* and is formed on the side of the long side 30*a* and the short side 30*d*. That is to say, the inlet 33*a* and the outlet 33*b* are formed in positions which are point-symmetric with respect to the central point of the bottom 33*d* of the cooling bottom plate 33. If the cooling bottom plate 33 is connected to the side wall 32, then the fastening reinforcing portions 30*e*1 are connected around the fastening holes in the cooling bottom plate 33. The cooling bottom plate 33 needs thickness which is such that the strength of the entire cooler 3 is maintained and such that cooling performance does not deteriorate. Moreover, as described later, the cooling bottom plate 33 needs strength to fix a conduit to the inlet 33*a* and the outlet 33*b*. Accordingly, the thickness of the cooling bottom plate 33 is larger than or equal to 1.0 time the thickness of the top plate 31 and smaller than or equal to 5.0 times the thickness of the top plate 31. The thickness of the cooling bottom plate 33 is preferably larger than or equal to 2.0 times the thickness of the top plate 31 and smaller than or equal to 3.0 times the thickness of the top plate 31. For example, it is preferable that the thickness of the cooling bottom plate 33 be larger than or equal to 2.0 mm and smaller than or equal to 10.0 mm.

The flow path area 31*a* surrounded by the top plate 31, the side wall 32, and the cooling bottom plate 33 is formed inside the cooler 3 having the above structure. The flow path area 31*a* is divided further into the cooling subarea 31*b* and the communicating subareas 31*c* and 31*d*. The plurality of radiation fins 34 which connect the top plate 31 and the cooling bottom plate 33 extend in the cooling subarea 31*b*. The communicating subareas 31*c* and 31*d* are formed by the top plate 31, the side wall 32, and the cooling bottom plate 33. The communicating subarea 31*d* is connected to the cooling subarea 31*b*. The refrigerant which flows in from the inlet 33*a* flows from the communicating subarea 31*d* to the cooling subarea 31*b*. The communicating subarea 31*c* is connected to the cooling subarea 31*b*. The refrigerant which flows from the cooling subarea 31*b* flows in to the communicating subarea 31*c* and flows out from the outlet 33*b*. The flow of the refrigerant in the cooler 3 will be described later. Furthermore, the cooler 3 includes the outer edge areas 31*e* and 31*f* of the top plate 31, the outside of the side wall 32, and the cooling bottom plate 33.

The cooler 3 contains as a main ingredient metal, such as copper, aluminum, or an alloy containing at least one of them, having high thermal conductivity. For example, the linear expansion coefficient of the cooler 3 containing copper is larger than or equal to $16 \times 10^{-6}$/K and smaller than or equal to $18 \times 10^{-6}$/K. The elastic modulus of the cooler 3 containing copper is larger than or equal to 50 GPa and smaller than or equal to 150 GPa. The linear expansion coefficient of the cooler 3 containing aluminum is larger than or equal to $23 \times 10^{-6}$/K and smaller than or equal to $24 \times 10^{-6}$/K. The elastic modulus of the cooler 3 containing aluminum is larger than or equal to 50 GPa and smaller than or equal to 100 GPa. In order to improve the corrosion resistance of the cooler 3, plating treatment may be performed. At this time, nickel, a nickel-phosphorus alloy, a nickel-boron alloy, or the like is used as a plating material. Furthermore, the top plate 31 on which the plurality of radiation fins 34 are formed is formed by forging, casting (die casting), or the like. If forging is performed, then a member in a block state containing the above metal as a main ingredient is pressurized by the use of a metal mold to cause plastic deformation. By doing so, the top plate 31 on which the plurality of radiation fins 34 and the side wall 32 are formed is obtained. If die casting is performed, then a molten die casting material is poured into a determined mold. After cooling is performed, the die casting material is taken out of the mold. By doing so, the top plate 31 on which the plurality of radiation fins 34 and the side wall 32 are formed is obtained. Furthermore, at this time, an aluminum-based alloy or the like is used as a die casting material. Alternatively, the top plate 31 on which the plurality of radiation fins 34 and the side wall 32 are formed may be formed by cutting a member in a block state containing the above metal as a main ingredient.

The cooling bottom plate 33 is bonded to the plurality of radiation fins 34 and the side wall 32 of the top plate 31. At this time, bonding is performed by brazing. Accordingly, the back surface corresponding to an end portion of the side wall 32 extending from the principal plane (back surface) of the top plate 31 and end portions of the plurality of radiation fins 34 are bonded to the front surface of the cooling bottom plate 33 with a brazing filler metal therebetween. The cooler 3 has what is called a closed structure. If the top plate 31 is formed by casting, then the melting point of a brazing filler metal used in the brazing is lower than that of a die casting material. Such a brazing filler metal is, for example, an alloy containing aluminum as a main ingredient.

The fastening reinforcing portions 30e1 formed separately from the top plate 31 may be bonded to the cooling bottom plate 33 by brazing. Furthermore, in this embodiment, a case where the plurality of radiation fins 34 are connected to the top plate 31 is described. However, the plurality of radiation fins 34 may be formed in an area of the cooling bottom plate 33 corresponding to the cooling subarea 31b. The cooler 3 is obtained in the above way.

The flow of the refrigerant in the cooler 3 will now be described with reference to FIG. 9 (and FIG. 8). FIG. 9 is a view for describing the flow of the refrigerant in the cooler included in the semiconductor device according to the first embodiment. FIG. 9 is a sectional view taken along the dot-dash line X-X of FIG. 8. FIG. 9 illustrates only the cooler 3 and does not illustrate the enclosure 20.

As stated above, the refrigerant circulates through the cooler 3 by the pump. In order to circulate the refrigerant, a water supply head 36a is fixed to the seal area around the inlet 33a with circular rubber packing 35a therebetween. A conduit 37a is fixed to the water supply head 36a. Furthermore, a water supply head 36b is fixed to the seal area around the outlet 33b with circular rubber packing 35b therebetween. A conduit 37b is fixed to the water supply head 36b. The pump is connected to the conduits 37a and 37b. The seal areas extend in plan view from the outer edges of the inlet 33a and the outlet 33b to positions. The distance between the outer edges of the inlet 33a and the outlet 33b and the positions may be longer than or equal to 0.2 times the width of the inlet 33a and the outlet 33b and shorter than or equal to 2.0 times the width of the inlet 33a and the outlet 33b. The width of the inlet 33a and the outlet 33b may be the shortest distance through the centroids of the inlet 33a and the outlet 33b. For example, if the inlet 33a and the outlet 33b have a rectangular shape or have the shape of a slot, then the width of the inlet 33a and the outlet 33b may be the distance between the long sides. If the inlet 33a and the outlet 33b are elliptical, then the width of the inlet 33a and the outlet 33b may be the length of the minor axis. If the inlet 33a and the outlet 33b are circular, then the width of the inlet 33a and the outlet 33b may be the diameter. In addition, the seal areas may extend in plan view for twenty millimeters from the outer edges of the inlet 33a and the outlet 33b. The seal areas may preferably extend for ten millimeters from the outer edges of the inlet 33a and the outlet 33b.

As illustrated in FIG. 8, the refrigerant which flows in from the inlet 33a flows into the communicating subarea 31d and spreads in the communicating subarea 31d. The refrigerant which flows in from the communicating subarea 31d spreads to the side of the short side 30b (in the X direction) and also spreads to the side of the long side 30a (in the +Y direction). Furthermore, when the refrigerant flows in from the inlet 33a, the refrigerant directly spreads to the side of the long side 30a (in the +Y direction). The refrigerant flows in this way into the whole of a side portion of the cooling subarea 31b opposite the long side 30c.

As illustrated in FIG. 9, the refrigerant which flows into the side portion (on the side of the long side 30c) of the cooling subarea 31b flows between the plurality of radiation fins 34 to the side of the long side 30a (in the +Y direction). Heat generated by the semiconductor units 10 is conducted via the top plate 31 to the plurality of radiation fins 34. When the refrigerant flows between the plurality of radiation fins 34, the refrigerant receives heat from the plurality of radiation fins 34. Accordingly, the heat generated by the semiconductor units 10 is easily conducted to the plurality of radiation fins 34. Much heat is conducted to the refrigerant flowing through a gap between the plurality of radiation fins 34. This improves cooling performance.

As illustrated in FIG. 8 (and FIG. 9), the refrigerant which receives heat in this way flows from a side portion of the cooling subarea 31b opposite the long side 30a into the communicating subarea 31c and flows out from the outlet 33b to the outside. At this time, the refrigerant flowing out contains heat conducted from the plurality of radiation fins 34. The refrigerant flowing out is cooled by the radiator and flows in again from the inlet 33a to the cooler 3 by the pump. The refrigerant circulates through the cooler 3 and therefore heat generated by the semiconductor units 10 is dissipated to the outside. As a result, the semiconductor units 10 are cooled.

Figure 10:
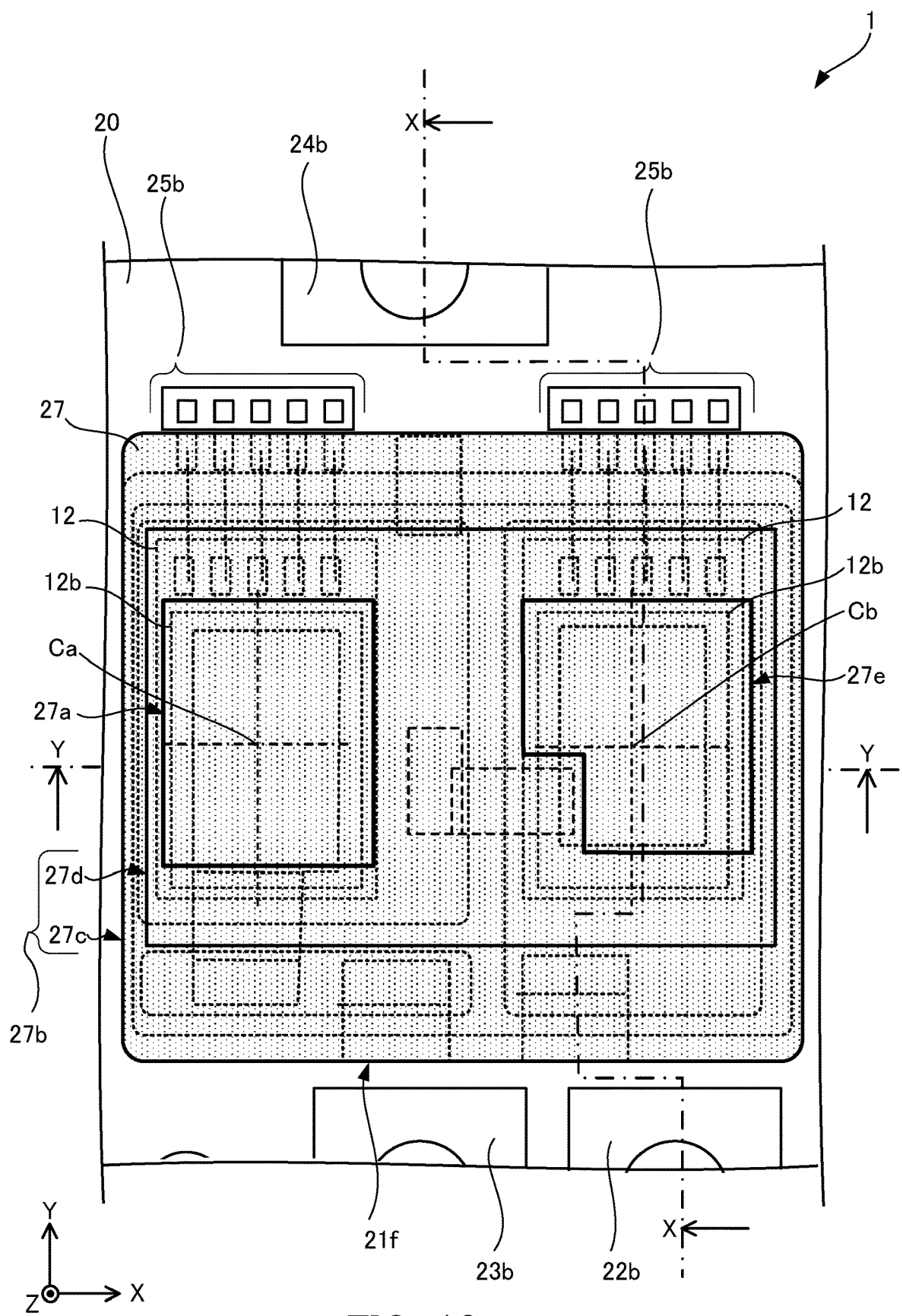
FIG. 10 is a fragmentary plan view of the semiconductor device according to the first embodiment.
Figure 11:
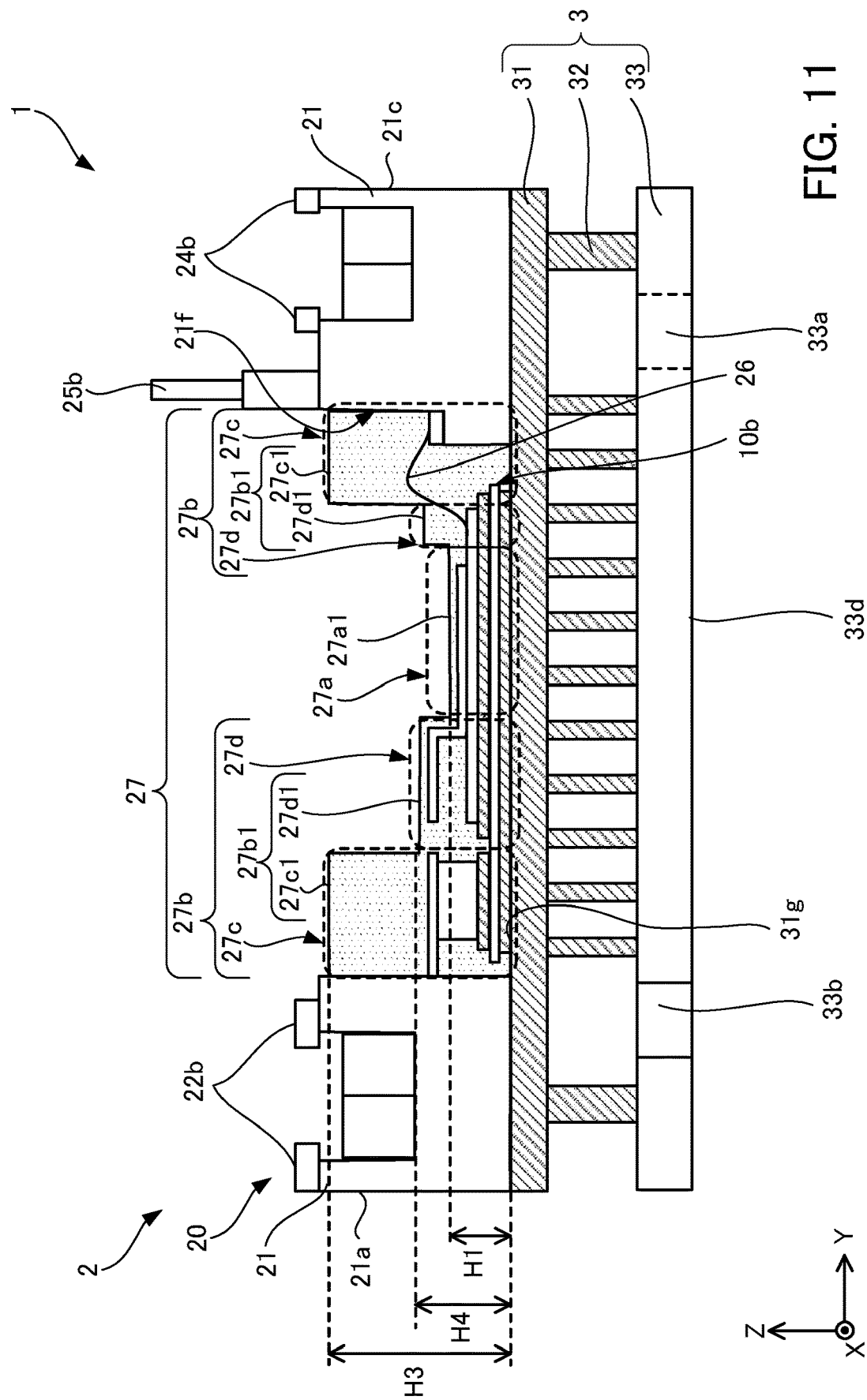
FIG. 11 is a sectional view of the semiconductor device according to the first embodiment (part 1)
Figure 12:
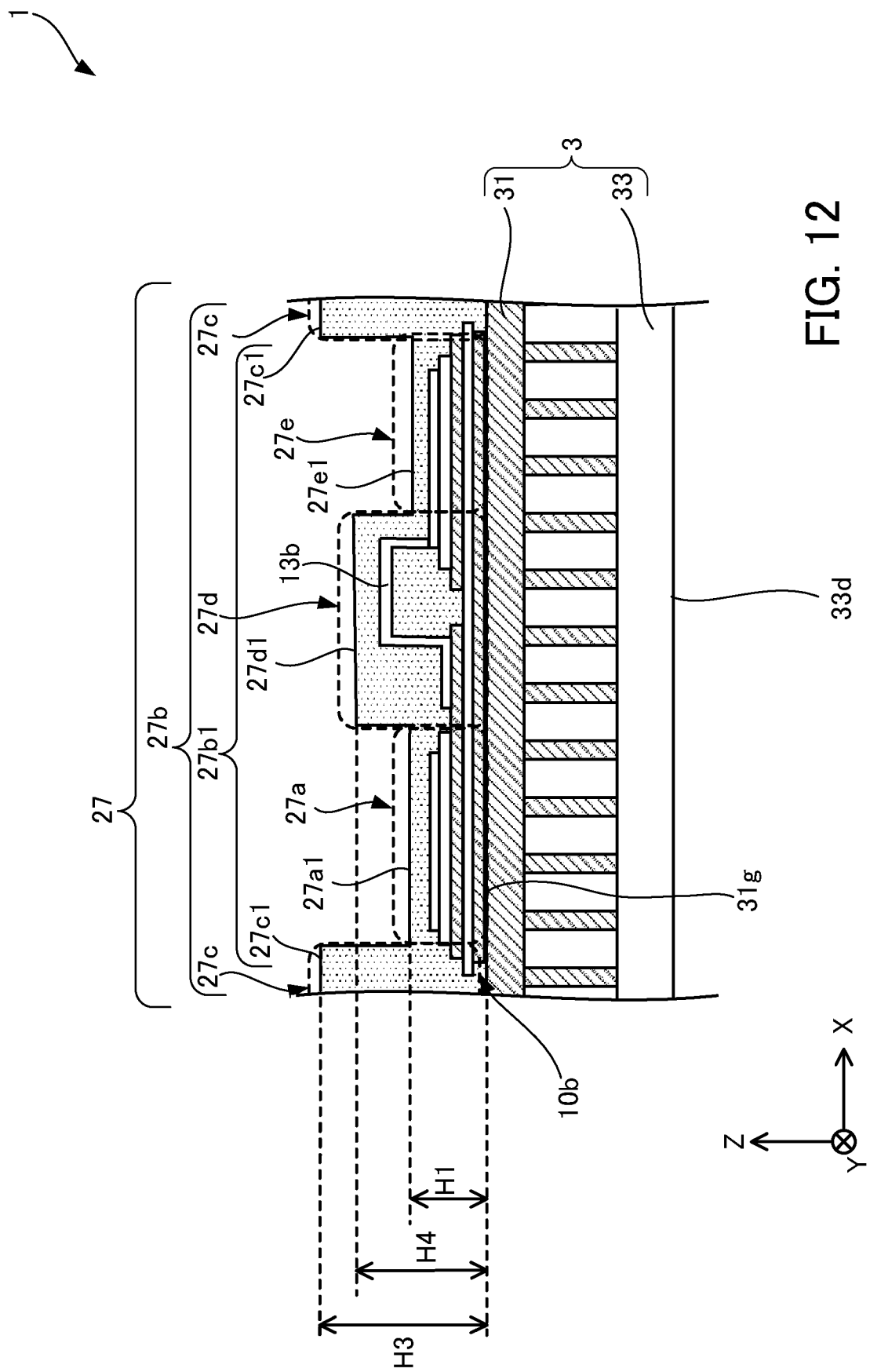
FIG. 12 is a sectional view of the semiconductor device according to the first embodiment (part 2)

The sealing member 27 used for sealing the semiconductor units 10a, 10b, and 10c housed in the unit housing portions 21e, 21f, and 21g, respectively, of the enclosure 20 will now be described with reference to FIGS. 10 through 12. FIG. 10 is a fragmentary plan view of the semiconductor device according to the first embodiment. FIGS. 11 and 12 are sectional views of the semiconductor device according to the first embodiment. FIGS. 10 through 12 illustrate the unit housing portion 21f of the enclosure which houses the semiconductor unit 10b. The unit housing portions 21e and 21g also house the semiconductor units 10a and 10c, respectively, and are sealed with the sealing member 27. This is the same with the unit housing portion 21f. Furthermore, in FIG. 10, the position of the semiconductor unit 10b in the sealing member 27 is indicated by dashed lines (numerals are omitted). FIG. 11 is a sectional view taken along the dot-dash line X-X of FIGS. 1 and 10. FIG. 12 is a sectional view taken along the dot-dash line Y-Y of FIG. 10.

The sealing member 27 seals the whole of the semiconductor unit 10b over the cooling surface 31g of the top plate 31 in the unit housing portion 21f of the enclosure 20. The sealing member 27 includes first portions 27a and 27e and a second portion 27b which surrounds the first portions 27a and 27e in plan view.

The first portions 27a and 27e seal central portions of the main electrodes 12b on the front surfaces of the semiconductor chips 12 (over the wiring boards 11b2 and 11b1, respectively). The first portions 27a and 27e include first sealing surfaces 27a1 and 27e1, respectively, opposite the cooling surface 31g of the top plate 31. At this time, the distance (thickness) from the cooling surface 31g to the first sealing surfaces 27a1 and 27e1 is a first thickness H1. The first thickness H1 may be the same between the plurality of semiconductor chips 12. Alternatively, the first thickness H1 may be different between the plurality of semiconductor chips 12. The first thickness H1 is preferably approximately the same between the plurality of semiconductor chips 12. That is to say, the first portions 27a and 27e seal central portions Ca and Cb of the main electrode bonding portions 13a1 and 13b1 of the lead frames 13a and 13b, respectively, formed on the main electrodes 12b of the semiconductor chips 12. The thickness of the sealing member 27 from the front surfaces of the main electrode bonding portions 13a1 and 13b1 to the first sealing surfaces 27a1 and 27e1 of the first portions 27a and 27e opposite the main electrode bonding portions 13a1 and 13b1 is larger than or equal to 0.8 mm and smaller than or equal to 2.0 mm and is preferably smaller than or equal to 1.2 mm.

The first portions 27a and 27e may extend in the +Y direction in plan view to an area in which the wires 26 are connected to the control electrodes 12a of the semiconductor chips 12. The first portion 27a may extend in the −Y direction to an area in which the first vertical connecting portion 13a2 and the main electrode bonding portion 13a1 are connected. The first portion 27e may extend in the −Y direction to an end portion in the −Y direction of the main electrode bonding portion 13b1.

The first portion 27a may extend in the +X direction in plan view to an area in which the second vertical connecting portion 13b4 and the wiring bonding portion 13b5 of the lead frame 13b are connected. In FIG. and FIG. 12, an end portion in the +X direction of the first portion 27a extends in plan view to an end portion in the +X direction of the main electrode 12b of the semiconductor chip 12. The first portion 27a may extend in the −X direction in plan view to an end portion in the −X direction of the main electrode 12b of the semiconductor chip 12 (over the wiring board 11b2).

The first portion 27e may extend in the +X direction in plan view to an end portion in the +X direction of the main electrode 12b of the semiconductor chip 12 (over the wiring board 11b1). The first portion 27e may also extend in the −X direction in plan view to an end portion in the −X direction of the main electrode 12b of the semiconductor chip 12 (over the wiring board 11b1). However, an end portion in the −X direction of the first portion 27e may extend to an area in which the first vertical connecting portion 13b2 and the main electrode bonding portion 13b1 of the lead frame 13b are connected. Accordingly, the first portion 27e has in plan view a shape which is such that a notch is formed at a corner in the −Y direction and −X direction.

The second portion 27b seals wiring portions except the central portions of the main electrodes 12b of the semiconductor chips 12 (over the wiring boards 11b1 and 11b2). The wiring portions are included in or bonded to the semiconductor unit 10b. For example, the wiring portions are the first vertical connecting portions 13a2 and 13b2, the horizontal connecting portions 13a3 and 13b3, and the second vertical connecting portions 13a4 and 13b4 included in the lead frames 13a and 13b, respectively, and the wires 26. Furthermore, the wiring portions are the end portions of the first connection terminals 22a, 22b, and 22c and the second connection terminals 23a, 23b, and 23c exposed in the unit housing portions 21e, 21f, and 21g, respectively. In addition, the wiring portions are the end portions of the U-phase output terminal 24a, the V-phase output terminal 24b, and the W-phase output terminal 24c.

The second portion 27b has a second sealing surface 27b1 opposite the cooling surface 31g of the top plate 31. At this time, the distance (thickness) from the cooling surface 31g to the second sealing surface 27b1 is a second thickness. The second thickness is larger (thicker) than the first thickness H1. As described later, the second thickness includes a plurality of thicknesses according to portions included in the second portion 27b. For example, the second thickness includes a third thickness H3 and a fourth thickness H4.

At this time, the second portion 27b may include a plurality of portions having thicknesses corresponding to the height of the sealed wiring portions from the insulated circuit board 11 (from the cooling surface 31g of the top plate 31). For example, the second portion 27b further includes a third portion 27c and a fourth portion 27d and the second sealing surface 27b1 includes a third sealing surface 27c1 and a fourth sealing surface 27d1.

The third portion 27c seals an outermost edge of the second portion 27b in plan view and is in contact with the surface of an inner wall of the unit housing portion 21f of the enclosure 20. The third portion 27c has a third sealing surface 27c1 opposite the cooling surface 31g of the top plate 31. The third portion 27c has the third thickness H3 from the cooling surface 31g of the top plate 31 to the third sealing surface 27c1. The third thickness H3 is the largest of the plurality of thicknesses included in the second thickness.

The third portion 27c seals in plan view wiring portions included in an outer peripheral edge of the semiconductor unit 10b and the vicinity of an inner wall portion of the unit housing portion 21f. For example, the third portion 27c seals the wires 26, the end portion of the first connection terminal 22b, and the end portion of the second connection terminal 23b in the ±Y direction. The third portion 27c seals a side portion in the −X direction of the insulated circuit board 11 (of the wiring board 11b2) and a side portion in the +X direction of the insulated circuit board 11 (of the wiring board 11b1). Furthermore, the third sealing surface 27c1 is approximately parallel to the cooling surface 31g of the top plate 31.

The fourth portion 27d seals in plan view wiring portions outside the first portions 27a and 27e and inside the third portion 27c. The fourth portion 27d seals in plan view wiring portions between the first portions 27a and 27e and the third portion 27c. The fourth portion 27d seals the horizontal connecting portion 13b3 and has the fourth sealing surface 27d1 opposite the cooling surface 31g. The fourth sealing surface 27d1 seals the entire front surface of the horizontal connecting portion 13b3. Specifically, the fourth sealing surface 27d1 seals in plan view the entire front surface of the horizontal connecting portion 13b3 between the first vertical connecting portion 13b2 and the second vertical connecting portion 13b4. Furthermore, the fourth portion 27d seals the wires 26 on the side of the control electrodes 12a of the semiconductor chips 12. That is to say, the wires 26 which connect the control electrodes 12a of the semiconductor chips 12 and the control terminals 25b and which form an arch are sealed with the fourth portion 27d and the third portion 27c. Crowns of the wires 26 which form an arch are sealed with the third portion 27c. The fourth portion 27d has the fourth thickness H4 from the cooling surface 31g of the top plate 31 to the fourth sealing surface 27d1. At this time, the thickness of the sealing member 27 from the front surface of the horizontal connecting portion 13b3 to the fourth sealing surface 27d1 opposite the horizontal connecting portion 13b3 is larger than or equal to 0.8 mm and smaller than or equal to 2.0 mm. Furthermore, the thickness of the sealing member 27 from the front surfaces of the main electrode bonding portions 13a1 and 13b1 to the first sealing surfaces 27a1 and 27e1 of the first portions 27a and 27e opposite the main electrode bonding portions 13a1 and 13b1, respectively, may be larger than or equal to 80 percent of the thickness of the sealing member 27 from the front surface of the horizontal connecting portion 13b3 to the fourth sealing surface 27d1 opposite the horizontal connecting portion 13b3 and smaller than or equal to 120 percent of the thickness of the sealing member 27 from the front surface of the horizontal connecting portion 13b3 to the fourth sealing surface 27d1 opposite the horizontal connecting portion 13b3. It is preferable that the thickness of the sealing member 27 from the front surfaces of the main electrode bonding portions 13a1 and 13b1 to the first sealing surfaces 27a1 and 27e1 of the first portions 27a and 27e opposite the main electrode bonding portions 13a1 and 13b1, respectively, be approximately the same as the thickness of the sealing member 27 from the front surface of the horizontal connecting portion 13b3 to the fourth sealing surface 27d1 opposite the horizontal connecting portion 13b3. The fourth thickness H4 is smaller than the third thickness H3. Accordingly, the third thickness H3 is larger than the fourth thickness H4 and the fourth thickness H4 is larger than the first thickness H1. In addition, the fourth sealing surface 27d1 is approximately parallel to the cooling surface 31g of the top plate 31.

An inner wall of the sealing member 27 which connects the first sealing surface 27a1 and the fourth sealing surface 27d1 and an inner wall of the sealing member 27 which connects the fourth sealing surface 27d1 and the third sealing surface 27c1 are perpendicular to the cooling surface 31g of the top plate 31. Furthermore, there is need for the sealing member 27 to have an opening over the central portions Ca and Cb of the main electrodes 12b of the semiconductor chips 12 (over the wiring boards 11b2 and 11b1, respectively). Therefore, the inner walls may be inclined. In addition, connecting portions of the inner walls may form a round surface. There is need for the sealing member 27 to have an opening over the central portions Ca and Cb of the main electrodes 12b of the semiconductor chips 12 (over the wiring boards 11b2 and 11b1, respectively). Accordingly, the first portions 27a and 27e may be circular or elliptical including the central portions Ca and Cb, respectively, in shape in plan view.

When the semiconductor chips 12 included in the semiconductor device 1 are energized and driven, the semiconductor chips 12 generate heat. At this time, temperature suddenly rises near the central portions Ca and Cb of the main electrodes 12b of the semiconductor chips 12 over the wiring boards 11b2 and 11b1, respectively. Furthermore, temperature does not rise at a position distant from the central portions Ca and Cb of the main electrodes 12b of the semiconductor chips 12 over the wiring boards 11b2 and 11b1, respectively. The main electrode bonding portions 13a1 and 13b1 of the lead frames 13a and 13b, respectively, bonded to the main electrodes 12b of the semiconductor chips 12 and the insulated circuit board 11 (wiring boards 11b2 and 11b1) to which the back surfaces of the semiconductor chips 12 are bonded expand thermally due to a rise (change) in temperature. In addition, the cooler 3 (top plate 31) right under the semiconductor chips 12 also expands thermally according to a rise in temperature. The difference in linear expansion coefficient among the semiconductor chips 12, the lead frames 13a and 13b, the wiring boards 11b2 and 11b1, and the cooler 3 which expand thermally in this way causes distortion (warp) in the ±Z direction of the central portions Ca and Cb of the semiconductor unit 10b. Moreover, at this time, the cooler 3 right under the central portions Ca and Cb is also distorted in the same way.

If, at this time, the sealing member 27 having the third thickness H3 seals the whole of the unit housing portion 21f, then the above warp of the central portions Ca and Cb is restricted by the sealing member 27 and the plastic strain amplitude of the main electrodes 12b or the main electrode bonding portions 13a1 and 13b1 increases.

Plastic strain amplitude $\Delta\varepsilon_P$ is plastic strain amplitude caused by the operation and stoppage of the semiconductor device 1 and follows Manson-Coffin law indicated by $$\Delta\varepsilon_P \times N_f^b = c \qquad (1)$$

where $N_f$ is fatigue life and each of b and c is a constant which depends on a material. According to expression (1), in order to lengthen fatigue life, there is need to decrease plastic strain amplitude. An increase in plastic strain amplitude causes the appearance of a crack in the main electrodes 12b of the semiconductor chips 12 or the bonding member 14a or 14b on the back surface or the front surface of each semiconductor chip 12.

On the other hand, with the semiconductor device 1, the sealing member 27 includes the first portion 27a and the second portion 27b which surrounds the outside of the first portion 27a. The first portions 27a and 27e seal the central portions Ca and Cb of the main electrodes 12b of the semiconductor chips 12, respectively, have the first sealing surfaces 27a1 and 27e1, respectively, opposite the cooling surface 31g of the top plate 31, and have the first thickness H1 from the cooling surface 31g to the first sealing surfaces 27a1 and 27e1. The first thickness H1 is smaller than the second thickness which the second portion 27b has. Accordingly, restriction on the central portions Ca and Cb by the sealing member 27 lightens and the central portions Ca and Cb may freely deform. Stress created in the central portions Ca and Cb of the semiconductor unit 10b decreases according to a change in temperature. That is to say, plastic strain amplitude in the semiconductor unit 10b decreases. This suppresses the appearance of a crack in the main electrodes 12b of the semiconductor chips 12 or the bonding member 14a or 14b on the back surface or the front surface of each semiconductor chip 12.

Furthermore, with the sealing member 27 of the semiconductor device 1, the second portion 27b which surrounds the first portion 27a may reach an upper portion (upper end) of the unit housing portion 21f. Alternatively, the second portion 27b which surrounds the first portion 27a may reach about 70 percent of the height of the unit housing portion 21f to the upper portion. As a result, wiring portions over outer peripheral portions of the semiconductor chips 12 are sealed and insulation is maintained.

Figure 13:
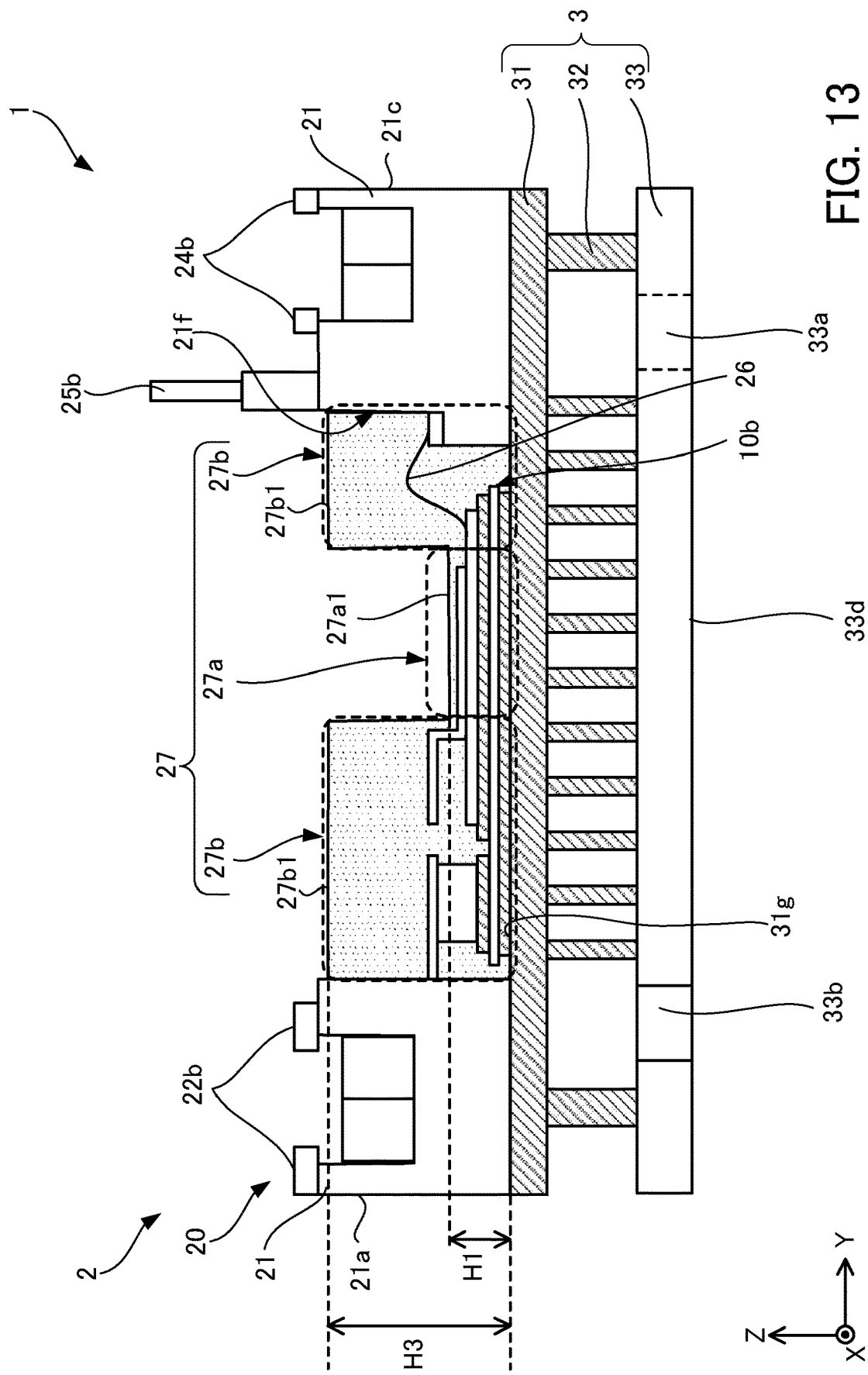
FIG. 13 is a sectional view of another semiconductor device according to the first embodiment (part 1)
Figure 14:
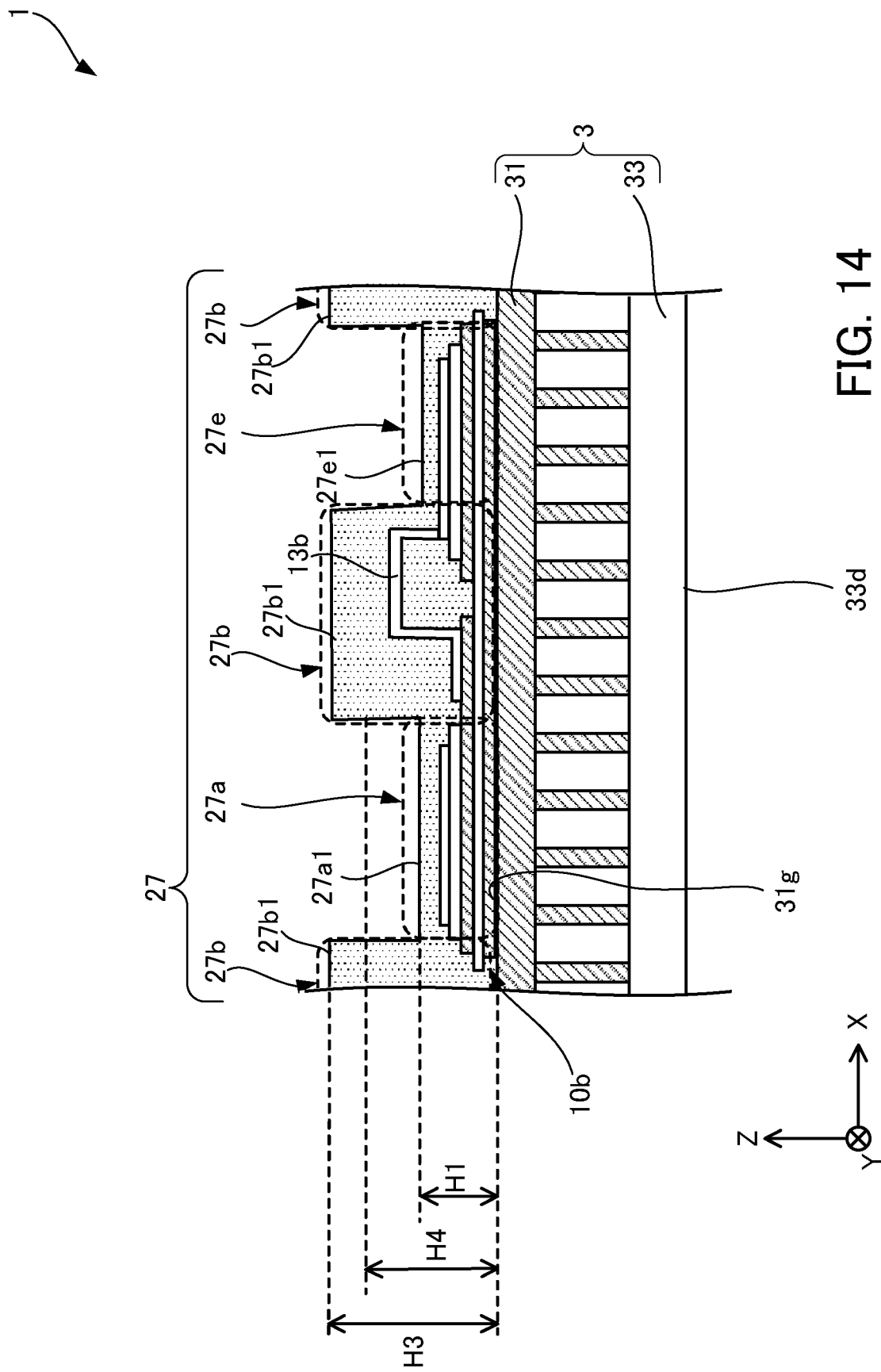
FIG. 14 is a sectional view of another semiconductor device according to the first embodiment (part 2)

In view of the above, the second thickness of the second portion 27b is larger than the first thickness H1 of the first portions 27a and 27e and the second portion 27b need only seal wiring portions in an outer peripheral portion of the semiconductor unit 10b. There is no need for the second portion 27b to include a plurality of portions. This semiconductor device 1 will be described with reference to FIG. 13 and FIG. 14. FIGS. 13 and 14 are sectional view of another semiconductor device according to the first embodiment. FIGS. 13 and 14 correspond to FIGS. 11 and 12 and illustrate another form of the sealing member 27.

There is no need for the second portion 27b of the sealing member 27 to include a plurality of portions. The second thickness may be the same as a whole. As illustrated in FIG.

13 and FIG. 14, for example, the second portion 27b surrounds the first portions 27a and 27e and seals wiring portions included in an outer peripheral portion of the semiconductor unit 10b. The second thickness from the front surface of the top plate 31 to the second sealing surface 27b1 of the second portion 27b is the same as a whole and is the same as the third thickness H3. Even in this case, stress created in the semiconductor chips 12 is decreased and insulation is maintained.

Figure 15:
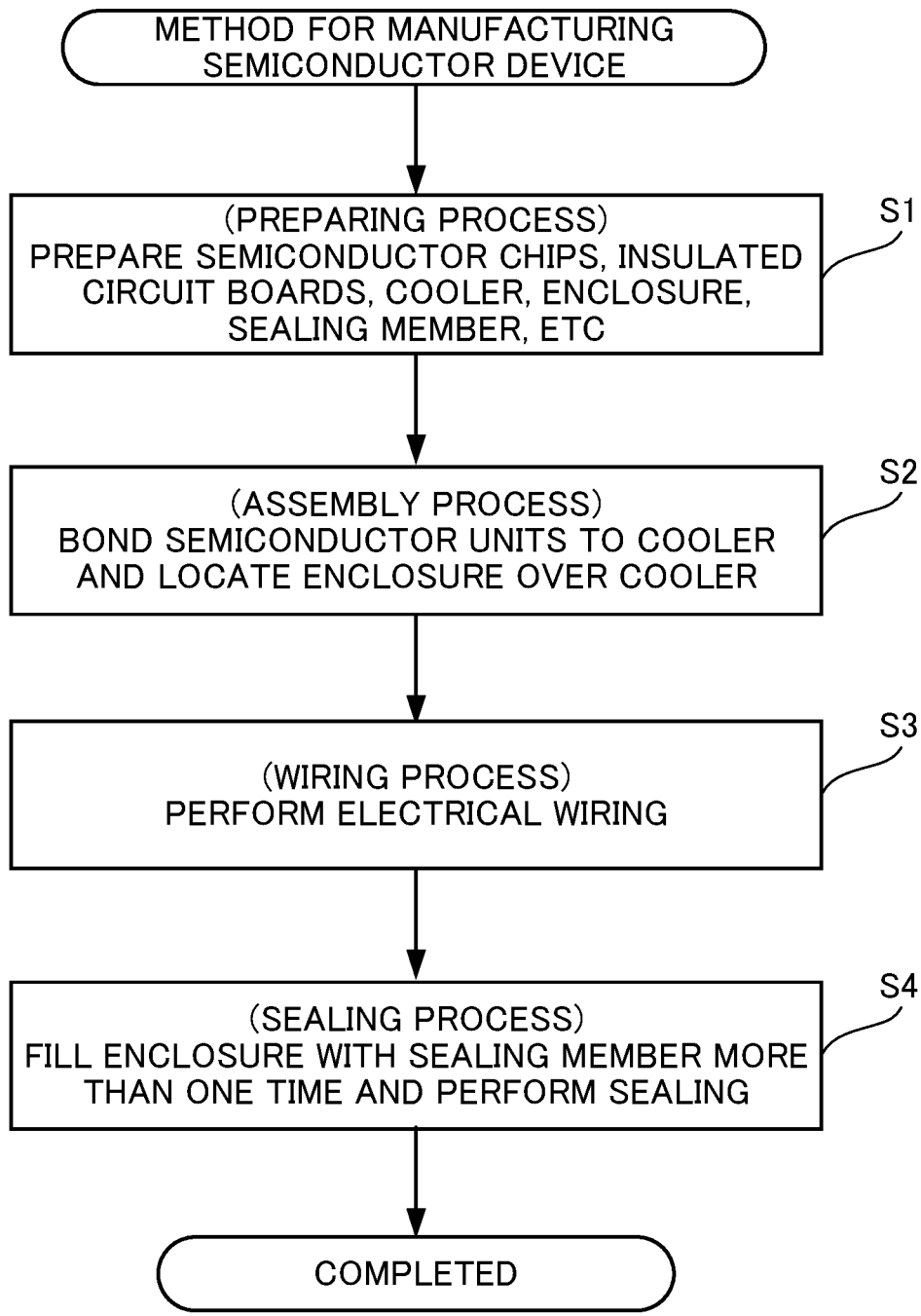
FIG. 15 is a flow chart illustrative of a method for manufacturing the semiconductor device according to the first embodiment.

A method for manufacturing the above semiconductor device 1 will now be described with reference to FIG. 15. FIG. 15 is a flow chart illustrative of a method for manufacturing the semiconductor device according to the first embodiment. First, a preparing process for preparing the components of the semiconductor device 1 and apparatus for manufacturing the semiconductor device 1 is performed (step S1 of FIG. 15). The components of the semiconductor device 1, such as the semiconductor chips 12, the insulated circuit boards 11, the cooler 3, the enclosure 20, a sealing member, and the lead frames 13a and 13b, are prepared. Furthermore, a wire bonder, a dispenser for resin sealing, and the like are prepared. In addition, the semiconductor chips 12 are bonded to the insulated circuit boards 11 and the lead frames 13a and 13b are bonded. By doing so, the semiconductor units 10 are assembled.

Next, an assembly process for bonding the semiconductor units 10 to the cooler 3 and locating the enclosure 20 over the cooler 3 is performed (step S2 of FIG. 15). The semiconductor units 10 are bonded to the cooling surface 31g of the top plate 31 of the cooler 3 with a bonding member therebetween. The enclosure 20 is fixed to the top plate 31 of the cooler 3 with an adhesive. At this time, the semiconductor units 10 are housed in the unit housing portions 21e, 21f, and 21g of the enclosure 20.

Next, a wiring process for electrically connecting the semiconductor chips 12 and the control terminals 25a, 25b, and 25c by the wires 26 and performing wiring is performed (step S3 of FIG. 15). The control electrodes 12a of the semiconductor chips 12 included in the semiconductor units 10 housed in the enclosure 20 and the control terminals 25a, 25b, and 25c integrally molded with the enclosure 20 are bonded together with the wires 26 by the use of the wire bonder. FIG. 1 and FIG. 11 may be referred to for the wires 26 used for bonding the control electrodes 12a and the control terminals 25a, 25b, and 25c.

Figure 16:
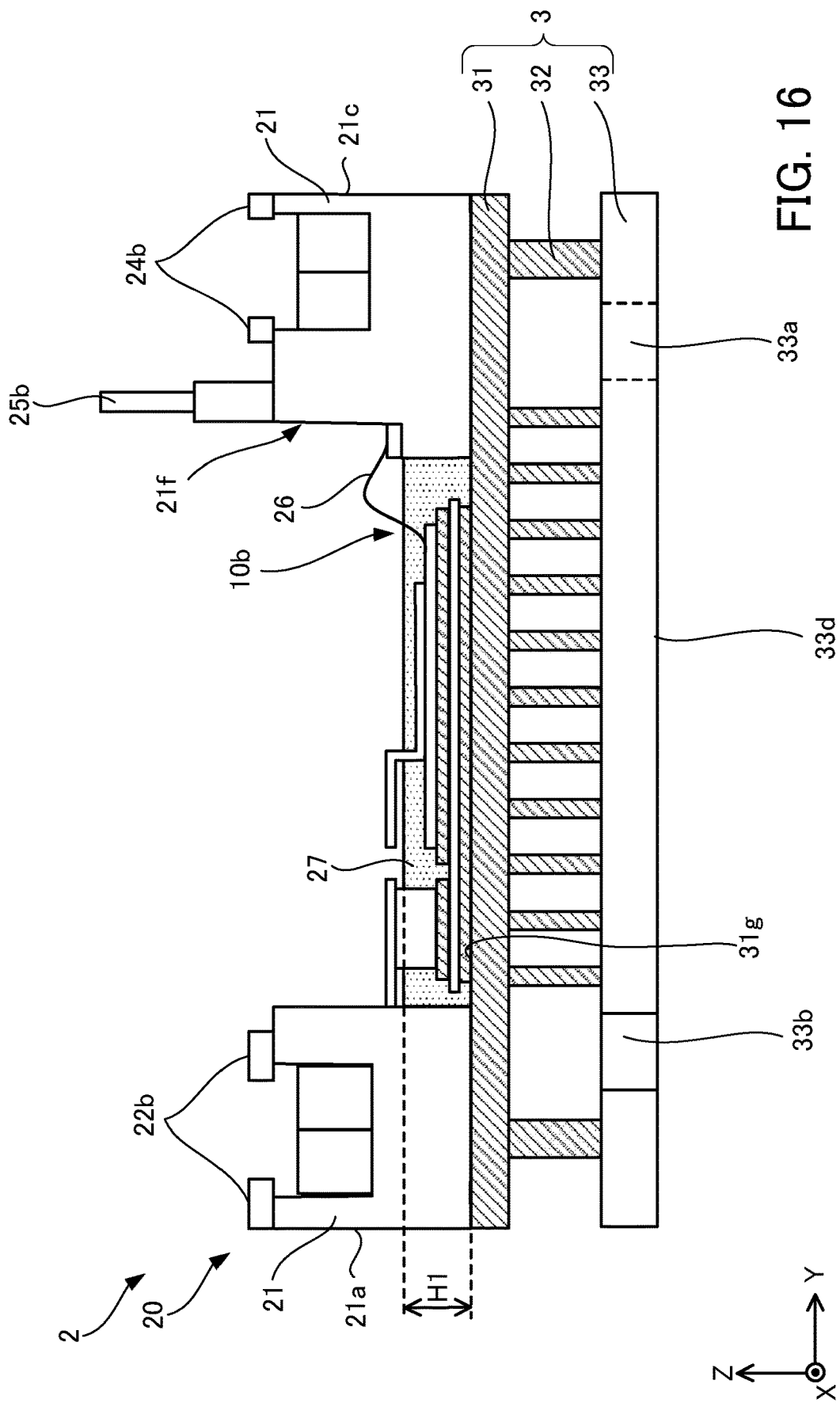
FIG. 16 illustrates a sealing process included in the method for manufacturing the semiconductor device according to the first embodiment (part 1)
Figure 17:
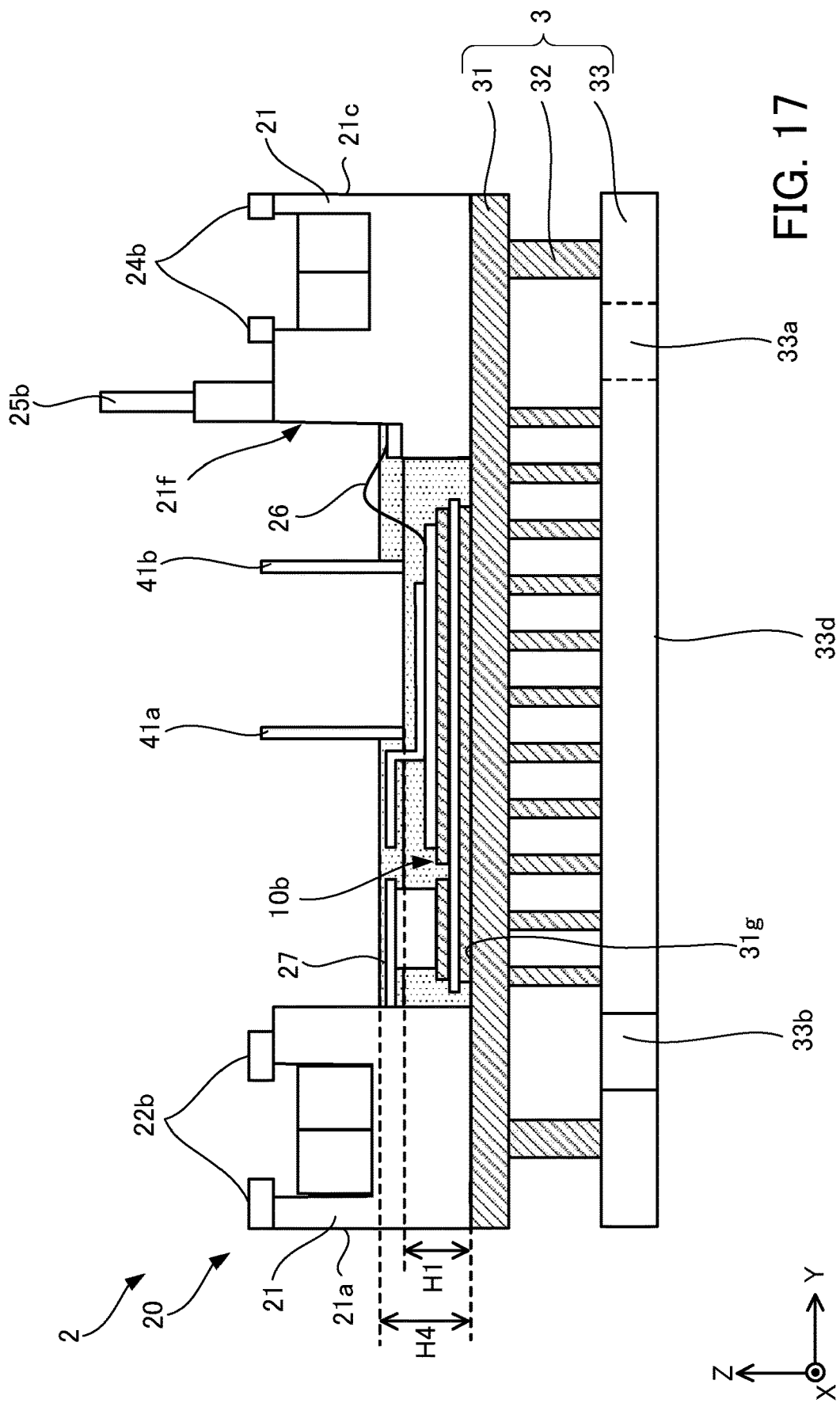
FIG. 17 illustrates a sealing process included in the method for manufacturing the semiconductor device according to the first embodiment (part 2)
Figure 18:
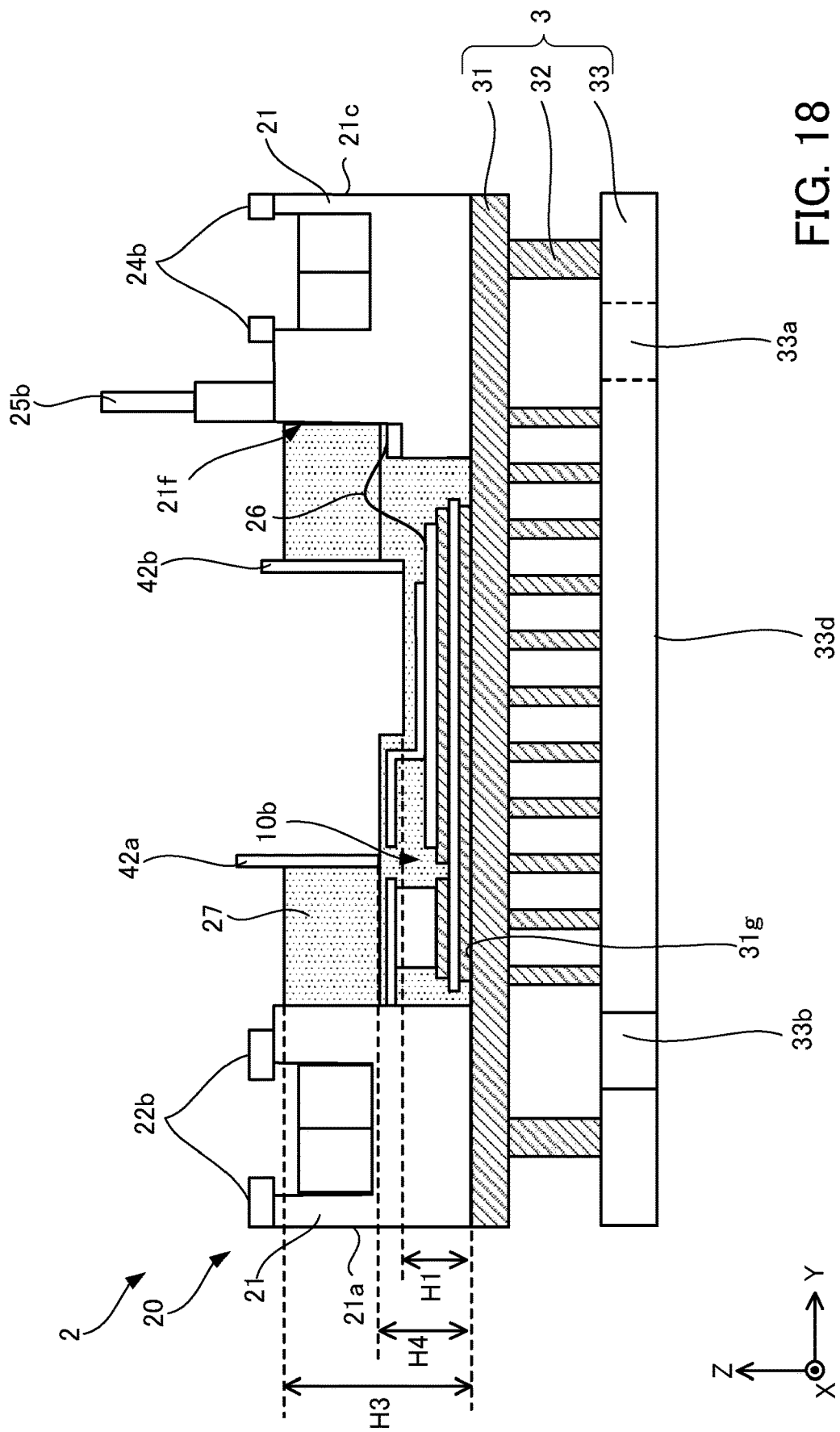
FIG. 18 illustrates a sealing process included in the method for manufacturing the semiconductor device according to the first embodiment (part 3)

Next, a sealing process for filling the unit housing portions 21e, 21f, and 21g of the enclosure 20 in which the semiconductor units 10 are housed with the sealing member 27 more than one time and performing sealing is performed (step S4 of FIG. 15). The sealing process will be described with reference to FIGS. 16 through 18. FIGS. 16 through 18 illustrate the sealing process included in the method for manufacturing the semiconductor device according to the first embodiment. FIGS. 16 through 18 correspond to the sectional view of FIG. 11. Furthermore, FIGS. 16 through 18 simply illustrate the unit housing portion 21f of the enclosure 20. The unit housing portions 21e and 21g are also sealed in the same way. The semiconductor unit 10b housed in the unit housing portion 21f of the enclosure 20 will be described. The same applies to the semiconductor units 10a and 10c housed in the unit housing portions 21e and 21g, respectively, of the enclosure 20.

The unit housing portion 21f of the enclosure 20 is filled with the sealing member 27 by the use of the dispenser. First, as illustrated in FIG. 16, the whole of the unit housing portion 21f is filled with the sealing member 27 to the first thickness H1 from the cooling surface 31g of the top plate 31.

Next, partition plates which surround in plan view central portions of the main electrodes 12b of the semiconductor chips 12 on all sides are fixed (along the black frames in FIG. 10 indicative of the first portions 27a and 27e). As illustrated in FIG. 17, for example, partition plates 41a and 41b are fixed substantially perpendicularly to the cooling surface 31g of the top plate 31 with the central portions of the main electrodes 12b of the semiconductor chips 12 left uncovered. The partition plates 41a and 41b may be made of a material, such as carbon or FeNi36 (Invar (registered trademark)), having a low thermal expansion coefficient. Furthermore, the partition plates 41a and 41b may be made of epoxy resin or polyphenylene sulfide resin. If the partition plates 41a and 41b made of such a material are used, then a process for removing the partition plates 41a and 41b is omitted after the unit housing portion 21f is filled with the sealing member 27. Alternatively, each of the partition plates 41a and 41b may be metal having a surface to which a mold release agent is applied. If the partition plates 41a and 41b made of such a material are used, then the partition plates 41a and 41b are properly removed after the unit housing portion 21f is filled with the sealing member 27. In addition, if the partition plates 41a and 41b are made of a material other than metal, then the material may contain a mold release agent to the sealing member 27 or a mold release agent may be applied to the surface.

Next, the unit housing portion 21f outside the partition plates 41a and 41b is filled further with the sealing member 27 by the use of the dispenser. That is to say, an area between the partition plates 41a and 41b and an inner wall of the unit housing portion 21f is filled in plan view with the sealing member 27. As illustrated in FIG. 17, at this time, the unit housing portion 21f is filled with the sealing member 27 to the fourth thickness H4 from the cooling surface 31g of the top plate 31.

Next, partition plates which surround in plan view the inside of an outermost portion of the unit housing portion 21f on all sides are fixed (along the black frame in FIG. 10 indicative of the first portion 27a). At this time, the partition plates 41a and 41b are removed in advance according to a material for the partition plates 41a and 41b. As illustrated in FIG. 18, for example, a partition plate 42a is located in the −Y direction inside the horizontal connecting portion 13a3 in the unit housing portion 21f. A partition plate 42b is located in the +Y direction inside a portion in the unit housing portion 21f at which the wire 26 is connected to the control electrode 12a. Furthermore, the partition plates 42a and 42b are located in the ±X direction inside a side portion of the insulated circuit board 11 in the unit housing portion 21f. The partition plates 42a and 42b are also made of the same material that is used for forming the partition plates 41a and 41b.

Next, the unit housing portion 21f outside the partition plates 42a and 42b is filled further with the sealing member 27 by the use of the dispenser. That is to say, an area between the partition plates 42a and 42b and the inner wall of the unit housing portion 21f is filled in plan view with the sealing member 27. As illustrated in FIG. 18, at this time, the unit housing portion 21f is filled with the sealing member 27 to the third thickness H3 from the cooling surface 31g of the top plate 31.

The unit housing portion 21f is filled in this way with the sealing member 27 three times and the sealing member 27 is solidified. By doing so, the semiconductor unit 10b is sealed. After the unit housing portion 21f is finally filled with the sealing member 27, the partition plates 42a and 42b are removed according to a material for the partition plates 42a and 42b. By doing so, the semiconductor device 1 illustrated in FIG. 1 and FIG. 2 is manufactured.

The above method for manufacturing the semiconductor device 1 is an example. As long as the sealing member 27 including the first portion 27a and the second portion 27b (third portion 27c and the fourth portion 27d) is formed, another method may be adopted. For example, a lid which fits the first portion 27a and the second portion 27b is formed in advance and the unit housing portion 21f which has the lid on may be sealed with the sealing member 27. Alternatively, after the unit housing portion 21f is sealed with a sealing member, the sealing member may be press-molded to obtain the sealing member 27 including the first portion 27a and the second portion 27b. Moreover, after the unit housing portion 21f is sealed with a sealing member and the sealing member is solidified, the sealing member may be cut to form the sealing member 27 including the first portion 27a and the second portion 27b.

The above semiconductor device 1 includes the cooler 3, the semiconductor units 10, and the sealing member 27. The cooler 3 includes the top plate 31. Each semiconductor unit 10 includes the insulated circuit board 11 located over the cooling surface 31g of the top plate 31 of the cooler 3, the semiconductor chips 12 located over the front surface of the insulated circuit board 11 and each having the main electrode 12b on the front surface, and the wiring portions electrically connected to the semiconductor chips 12. The sealing member 27 seals the semiconductor unit 10 and the whole of the semiconductor units 10 over the cooling surface 31g. The sealing member 27 includes the first portions 27a and 27e and the second portion 27b which surrounds the first portions 27a and 27e in plan view. The first portions 27a and 27e seal the central portions of the main electrodes 12b of the semiconductor chips 12, have the first sealing surfaces 27a1 and 27e1, respectively, opposite the cooling surface 31g of the top plate 31 of the cooler 3, and have the first thickness H1 from the cooling surface 31g to the first sealing surfaces 27a1 and 27e1, respectively. The second portion 27b surrounds the first portion 27a in plan view, seals the wiring portions, has the second sealing surface 27b1 opposite the cooling surface 31g of the top plate 31 of the cooler 3, and has the second thickness from the cooling surface 31g to the second sealing surface 27b1. The second thickness is larger than the first thickness H1. Accordingly, plastic strain which occurs in the semiconductor unit 10 is small. Because a strain amount of the semiconductor unit 10 decreases, stress applied to the semiconductor chips 12 becomes smaller. This suppresses the appearance of a crack in each semiconductor chip 12 or the bonding member 14a or 14b on the back surface or the front surface of each semiconductor chip 12. Accordingly, damage to the bonding member 14a or 14b on the back surface or the front surface of each semiconductor chip 12 is reduced, deterioration in the reliability of the semiconductor device 1 is suppressed, and the life of the semiconductor device 1 is lengthened.

Second Embodiment

Figure 19:
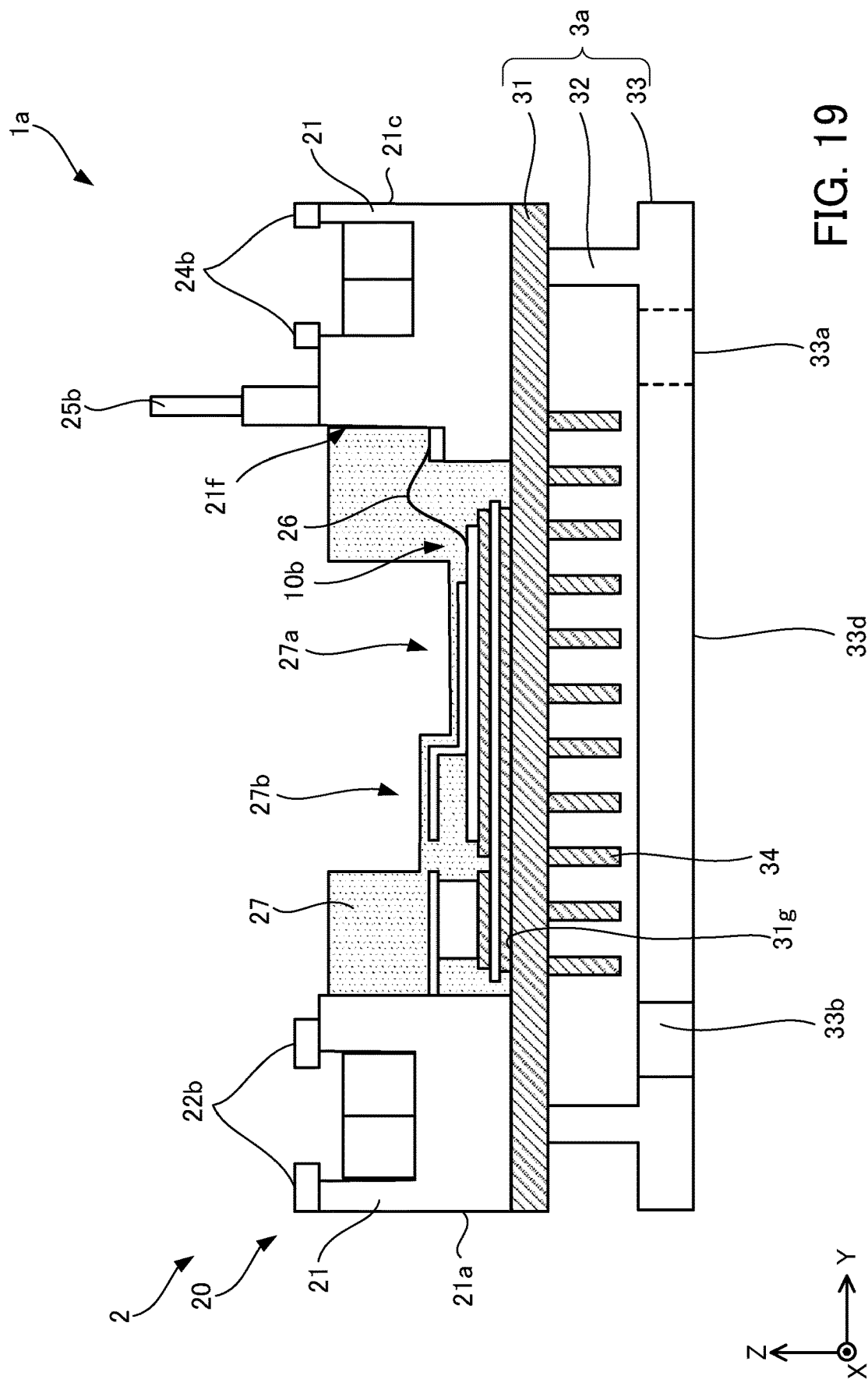
FIG. 19 is a sectional view of a semiconductor device according to a second embodiment.

A cooler 3a included in a semiconductor device 1a according to a second embodiment has what is called an open structure. The semiconductor device 1a including the cooler 3a will be described with reference to FIG. 19. FIG. 19 is a sectional view of the semiconductor device according to the second embodiment. FIG. 19 corresponds to FIG. 11 in the first embodiment. The cooler 3a in the second embodiment includes a top plate 31, a plurality of radiation fins 34 formed in a cooling subarea 31b on the back surface of the top plate 31, a side wall 32 which is circularly connected to the back surface of the top plate 31 and which surrounds the cooling subarea 31b, and a cooling bottom plate 33 opposed to the top plate 31 and connected to the back surface of the side wall 32. This is the same with the cooler 3 in the first embodiment.

With the cooler 3a, however, one end of each of the plurality of radiation fins 34 is formed in the cooling subarea 31b on the back surface of the top plate 31 and the other end of each of the plurality of radiation fins 34 is not connected to the cooling bottom plate 33. That is to say, there is a gap between the other end of each of the plurality of radiation fins 34 and the cooling bottom plate 33. Furthermore, the side wall 32 is integrally connected to the cooling bottom plate 33.

With the semiconductor device 1a, the top plate 31 having the back surface on which the plurality of radiation fins 34 are formed is fixed to a semiconductor module 2. As illustrated in FIG. 19, the cooling bottom plate 33 to which the side wall 32 is connected is fixed to the top plate 31. By doing so, the cooler 3a is formed.

With the semiconductor device 1a, a first thickness H1 is also smaller than a second thickness of a second portion 27b. This is the same with the first embodiment. Accordingly, restriction by a sealing member 27 lightens and a semiconductor unit 10b is apt to be strained according to a change in temperature. Because a strain amount of the semiconductor unit 10b increases, stress applied to each semiconductor chip 12 (and a bonding member 14a or 14b on the back surface or the front surface of each semiconductor chip 12) decreases. This suppresses the appearance of a crack in each semiconductor chip 12 or the bonding member 14a or 14b on the back surface or the front surface of each semiconductor chip 12.

Furthermore, with the cooler 3a, there is a space between the plurality of radiation fins 34 and the cooling bottom plate 33. Accordingly, the amount of strain in the ±Z direction of the cooler 3a caused by a change in temperature is large compared with the cooler 3 in the first embodiment. That is to say, strain of the semiconductor unit 10b is often accompanied by strain of the cooler 3a, compared with the first embodiment. As a result, stress applied to each semiconductor chip 12 (and the bonding member 14a or 14b on the back surface or the front surface of each semiconductor chip 12) decreases. This suppresses the appearance of a crack in each semiconductor chip 12 or the bonding member 14a or 14b on the back surface or the front surface of each semiconductor chip 12.

According to the disclosed techniques, damage to a bonding member is reduced, deterioration in the reliability of a semiconductor device is suppressed, and the life of a semiconductor device is lengthened.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a cooling body that includes a top plate having a cooling surface;
a semiconductor unit, including:
a board located over the cooling surface of the top plate,
a semiconductor chip located over a front surface of the board, the semiconductor chip having a main electrode formed on a front surface thereof, and
a wiring portion electrically connected to the semiconductor chip; and
a sealing member which seals the entire semiconductor unit over the cooling surface, wherein:
the sealing member includes
a first portion that
seals a central portion of the main electrode, and
has a first sealing surface opposite the cooling surface, and
a second portion that
seals the wiring portion to thereby surround the first portion in a plan view of the semiconductor device, and
has a second sealing surface opposite the cooling surface; and
a first thickness, which is a distance in a thickness direction of the semiconductor device from the cooling surface to the first sealing surface, is smaller than a second thickness, which is a distance in the thickness direction from the cooling surface to the second sealing surface.

2. The semiconductor device according to claim 1, wherein:
the sealing member further includes a third portion, which is a part of the second portion,
seals an outermost edge of the second portion in the plan view, and
has a third sealing surface opposite the cooling surface; and
a third thickness is a distance in the thickness direction from the cooling surface to the third sealing surface.

3. The semiconductor device according to claim 2, further comprising an enclosure that is located over the cooling surface and that has an opening portion formed therein, to thereby surround the semiconductor unit on all sides, an inside of the opening portion being sealed with the sealing member,
wherein the third portion of the sealing member is in contact with an inner wall surface of the enclosure.

4. The semiconductor device according to claim 2, wherein:
the semiconductor chip further includes a control electrode formed on the front surface thereof;
the wiring portion includes a control wiring connected to the control electrode; and
the control wiring is sealed with the third portion of the sealing member.

5. The semiconductor device according to claim 4, wherein the first portion extends in the plan view to an area in which the control wiring is connected to the control electrode.

6. The semiconductor device according to claim 1, wherein the wiring portion includes
a bonding portion bonded to the main electrode and having a shape of a flat plate, and
a connecting portion connected in the plan view to an end portion of the bonding portion and rising upward with respect to the bonding portion.

7. The semiconductor device according to claim 6, wherein:
the sealing member further includes a third portion and a fourth portion, the third portion
being a part of the second portion,
surrounding the fourth portion in the plan view, and
having a third sealing surface opposite the cooling surface;
the fourth portion
being a part of the second portion,
sealing the connecting portion, and
having a fourth sealing surface opposite the cooling surface; and
a fourth thickness is a distance in the thickness direction from the cooling surface to the fourth sealing surface.

8. The semiconductor device according to claim 7, wherein a distance in the thickness direction from a front surface of the bonding portion to the first sealing surface of the first portion opposite the bonding portion is larger than or equal to 80 percent of, and smaller than or equal to 120 percent of, a distance in the thickness direction from a front surface of the connecting portion to the fourth sealing surface of the fourth portion opposite the connecting portion.

9. The semiconductor device according to claim 7, wherein:
a third thickness is a distance in the thickness direction from the cooling surface to the third sealing surface; and
the third thickness is larger than the fourth thickness, and the fourth thickness is larger than the first thickness.

10. The semiconductor device according to claim 6, wherein the first portion extends in the plan view to an area in which the connecting portion is connected to the bonding portion.

11. The semiconductor device according to claim 1, wherein the cooling body includes a plurality of fins which are formed on a principal plane of the top plate opposite to the cooling surface, for a refrigerant to flow therebetween.

12. The semiconductor device according to claim 11, wherein:
the cooling body further includes:
a bottom plate opposite the top plate; and
a side wall portion that surrounds the plurality of fins and that demarcates a flow area between the top plate and the bottom plate for the refrigerant to flow therein; and
end portions of the plurality of fins opposite to the top plate and an end portion of the side wall portion opposite to the top plate are bonded to the bottom plate.

13. The semiconductor device according to claim 1, wherein a linear expansion coefficient of the semiconductor chip is lower than linear expansion coefficients of the sealing member and the cooling body.

14. The semiconductor device according to claim 1, wherein an elastic modulus of the sealing member is smaller than an elastic modulus of the cooling body.

15. A semiconductor device manufacturing method, comprising:
preparing
a cooling body that includes a top plate having a cooling surface,
a semiconductor unit, including:
a board, a semiconductor chip located over a front surface of the board and having a main electrode formed on a front surface thereof, and a wiring portion electrically connected to the semiconductor chip, and a sealing member;

disposing the semiconductor unit on the cooling surface; and sealing the entire semiconductor unit over the cooling surface with the sealing member, such that the sealing member includes a first portion, which seals a central portion of the main electrode, and has a first sealing surface opposite the cooling surface, and a second portion, which seals the wiring portion to thereby surround the first portion in a plan view of the semiconductor device, and has a second sealing surface opposite the cooling surface, wherein a first thickness, which is a distance in a thickness direction of the semiconductor device from the cooling surface to the first sealing surface, is smaller than a second thickness, which is a distance in the thickness direction from the cooling surface to the second sealing surface.

16. The semiconductor device manufacturing method according to claim 15, wherein the sealing of the entire semiconductor unit with the sealing member includes:

sealing the semiconductor unit over the cooling surface to the first thickness with the sealing member; and further sealing the semiconductor unit, except for the first portion, to the second thickness with the sealing member.

17. The semiconductor device manufacturing method according to claim 16, wherein the sealing of the entire semiconductor unit with the sealing member further includes:

after sealing the semiconductor unit over the cooling surface to the first thickness, partitioning the first portion in the plan view with a partition plate, before sealing the semiconductor unit except for the first portion to the second thickness.

* * * * *